US012790199B2

(12) United States Patent
Hocking et al.

(10) Patent No.: US 12,790,199 B2
(45) Date of Patent: Nov. 10, 2026

(54) MEMS MIRROR ARRAYS WITH REDUCED COUPLING BETWEEN MIRRORS

(71) Applicant: Calient.AI Inc., Goleta, CA (US)

(72) Inventors: Andrew Hocking, Ithaca, NY (US); Scott A. Miller, Ithaca, NY (US)

(73) Assignee: CALIENT.AI INC., Goleta, CA (US)

( * ) Notice: Subject to any disclaimer, the term of this patent is extended or adjusted under 35 U.S.C. 154(b) by 542 days.

(21) Appl. No.: 18/352,357

(22) Filed: Jul. 14, 2023

(65) Prior Publication Data

US 2024/0025733 A1 Jan. 25, 2024

Related U.S. Application Data

(60) Provisional application No. 63/391,667, filed on Jul. 22, 2022.

(51) Int. Cl.

*G02B 26/08* (2006.01)
*B81B 3/00* (2006.01)
*B81C 1/00* (2006.01)

(52) U.S. Cl.

CPC ........ *B81B 3/0051* (2013.01); *B81C 1/00214* (2013.01); *B81B 2201/042* (2013.01); *B81B 2203/0154* (2013.01); *B81B 2203/0307* (2013.01); *B81C 2201/0156* (2013.01)

(58) Field of Classification Search

CPC ............ B81B 3/0051; B81B 2201/042; B81B 2203/0154; B81B 2203/0307; B81B 7/04; B81C 1/00214; B81C 2201/0156; G02B 26/0841

See application file for complete search history.

(56) References Cited

U.S. PATENT DOCUMENTS 3,493,820 A 2/1970 Rosvold
4,104,086 A 8/1978 Bondur et al.
4,421,381 A 12/1983 Ueda et al.
4,509,249 A 4/1985 Goto et al.
4,519,128 A 5/1985 Chesebro et al.
4,553,436 A 11/1985 Hansson
4,571,819 A 2/1986 Rogers et al.

(Continued)

FOREIGN PATENT DOCUMENTS

WO 1994018697 A1 8/1994
WO 1997004283 A2 2/1997

(Continued)

OTHER PUBLICATIONS

Kota, et al., Design of Compliant Mechanisms: Applications to MEMS (Dec. 31, 2001).

(Continued)

*Primary Examiner* — Euncha P Cherry

(74) *Attorney, Agent, or Firm* — Vitruvian IP Law LLC; Cecily Anne O'Regan

(57) ABSTRACT

A MEM array may comprise a first stage comprising a first stage reflective surface, and a second stage comprising a second stage reflective surface. The MEM array may comprise a base wafer positioned below the first stage and the second stage; and a first frame pivotally coupled to the first stage. The first frame may be pivotally coupled to a second frame, which may comprise a second frame high aspect ratio (AR) member that may be operable to reduce mechanical motion of the second stage.

30 Claims, 26 Drawing Sheets

(56) References Cited

U.S. PATENT DOCUMENTS

| | | | |
|---|---|---|---|
| 4,670,092 A | 6/1987 | Motamedi | |
| 4,688,069 A | 8/1987 | Joy et al. | |
| 4,706,374 A | 11/1987 | Murakami | |
| 4,784,720 A | 11/1988 | Douglas | |
| 4,855,017 A | 8/1989 | Douglas | |
| 4,876,217 A | 10/1989 | Zdebel | |
| 5,068,203 A | 11/1991 | Logsdon et al. | |
| 5,083,857 A | 1/1992 | Hornbeck | |
| 5,097,354 A | 3/1992 | Goto | |
| 5,172,262 A | 12/1992 | Hornbeck | |
| 5,198,390 A | 3/1993 | MacDonald et al. | |
| 5,203,208 A | 4/1993 | Bernstein | |
| 5,226,321 A | 7/1993 | Varnham et al. | |
| 5,235,187 A | 8/1993 | Arney et al. | |
| 5,316,979 A | 5/1994 | MacDonald et al. | |
| 5,393,375 A | 2/1995 | MacDonald et al. | |
| 5,397,904 A | 3/1995 | Arney et al. | |
| 5,399,415 A | 3/1995 | Chen et al. | |
| 5,426,979 A | 6/1995 | Kantorovich et al. | |
| 5,427,975 A | 6/1995 | Sparks et al. | |
| 5,428,259 A | 6/1995 | Suzuki | |
| 5,449,903 A | 9/1995 | Arney et al. | |
| 5,454,906 A | 10/1995 | Baker et al. | |
| 5,488,862 A | 2/1996 | Neukermans et al. | |
| 5,501,893 A | 3/1996 | Laermer et al. | |
| 5,536,988 A | 7/1996 | Zhang et al. | |
| 5,563,343 A | 10/1996 | Shaw et al. | |
| 5,610,335 A | 3/1997 | Shaw et al. | |
| 5,611,888 A | 3/1997 | Bosch et al. | |
| 5,611,940 A | 3/1997 | Zettler | |
| 5,626,790 A | 5/1997 | Minor | |
| 5,628,917 A | 5/1997 | MacDonald et al. | |
| 5,629,790 A | 5/1997 | Neukermans et al. | |
| 5,637,189 A | 6/1997 | Peeters et al. | |
| 5,645,684 A | 7/1997 | Keller | |
| 5,673,139 A | 9/1997 | Johnson | |
| 5,703,728 A | 12/1997 | Smith et al. | |
| 5,719,073 A | 2/1998 | Shaw et al. | |
| 5,726,913 A | 3/1998 | Grimsrud | |
| 5,770,465 A | 6/1998 | MacDonald et al. | |
| 5,798,557 A | 8/1998 | Salatino et al. | |
| 5,804,084 A | 9/1998 | Nasby et al. | |
| 5,846,849 A | 12/1998 | Shaw et al. | |
| 5,847,454 A | 12/1998 | Shaw et al. | |
| 5,853,959 A | 12/1998 | Brand et al. | |
| 5,915,168 A | 6/1999 | Salatino et al. | |
| 5,920,417 A | 7/1999 | Johnson | |
| 5,933,746 A | 8/1999 | Begley et al. | |
| 5,969,848 A | 10/1999 | Lee et al. | |
| 5,998,816 A | 12/1999 | Nakaki et al. | |
| 5,998,906 A | 12/1999 | Jerman et al. | |
| 5,999,303 A | 12/1999 | Drake | |
| 6,000,280 A | 12/1999 | Miller et al. | |
| 6,020,272 A | 2/2000 | Fleming | |
| 6,044,705 A | 4/2000 | Neukermans et al. | |
| 6,072,617 A | 6/2000 | Henck | |
| 6,075,639 A | 6/2000 | Kino et al. | |
| 6,097,858 A | 8/2000 | Laor | |
| 6,097,859 A | 8/2000 | Solgaard et al. | |
| 6,097,860 A | 8/2000 | Laor | |
| 6,101,299 A | 8/2000 | Laor | |
| 6,121,552 A | 9/2000 | Brosnihan et al. | |
| 6,307,452 B1 | 10/2001 | Sun | |
| 6,753,638 B2 | 6/2004 | Adams et al. | |
| 6,921,952 B2 | 7/2005 | Jeong | |
| 7,098,571 B2 | 8/2006 | Adams et al. | |
| 7,261,826 B2 | 8/2007 | Adams et al. | |
| 8,705,159 B2 | 4/2014 | Lee | |
| 8,904,866 B2 | 12/2014 | Hammer | |
| 9,237,402 B2 | 1/2016 | Loeppert | |
| 10,190,938 B2 | 1/2019 | Blomqvist et al. | |
| 11,186,478 B2 | 11/2021 | Langa et al. | |
| 2002/0146200 A1 | 10/2002 | Kudrle et al. | |
| 2008/0100899 A1 | 5/2008 | Shimokawa et al. | |
| 2008/0190198 A1 | 8/2008 | Prandi et al. | |
| 2008/0284028 A1 | 11/2008 | Greywall | |
| 2009/0059344 A1 | 3/2009 | Marxer et al. | |
| 2009/0196623 A1 | 8/2009 | Detry | |
| 2010/0263998 A1 | 10/2010 | Anderson et al. | |
| 2011/0018095 A1 | 1/2011 | Booth, Jr. et al. | |
| 2011/0140569 A1 | 6/2011 | Moidu | |
| 2011/0228440 A1 | 9/2011 | Kato et al. | |
| 2012/0133023 A1 | 5/2012 | Booth, Jr. et al. | |
| 2013/0147313 A1 | 6/2013 | Sachse | |
| 2014/0014480 A1 | 1/2014 | Anderson et al. | |
| 2015/0377711 A1* | 12/2015 | Steffanson | G02B 26/085<br>250/349 |
| 2019/0345023 A1 | 11/2019 | Duerr et al. | |
| 2020/0150416 A1 | 5/2020 | Zhou | |
| 2021/0396852 A1 | 12/2021 | Wang et al. | |
| 2022/0227621 A1 | 7/2022 | Miller | |

FOREIGN PATENT DOCUMENTS

| | | |
|---|---|---|
| WO | 1999036941 A2 | 7/1999 |
| WO | 2001057902 A2 | 8/2001 |
| WO | 2022010349 A1 | 1/2022 |
| WO | 2024020329 A1 | 1/2024 |

OTHER PUBLICATIONS

Saad, et al., Analysis of MEMS mechanical spring for coupling multimodal micro resonators sensor (Dec. 10, 2008).

Zhang, et al., Buckling analysis of planar compression micro-springs (Feb. 6, 2015).

* cited by examiner

300a

Frame Rotation

300b

Mirror Rotation

300c

X translate and rotate

300d

Z rotation

Y translate and rotate

Trampoline

300g

Frame Z Rotation

300h

Frame Only Rotation

MEMS MIRROR ARRAYS WITH REDUCED COUPLING BETWEEN MIRRORS

CROSS-REFERENCE

This application claims the benefit of U.S. Provisional Application No. 63/391,667, filed Jul. 22, 2022, entitled MEMS MIRROR ARRAYS WITH REDUCED COUPLING BETWEEN MIRRORS which application is incorporated herein in its entirety by reference.

BACKGROUND

Micromirror devices are microelectromechanical systems (MEMS) in which voltage may be applied between two electrodes in the device to control the state. Adjusting the state of the micromirror device may control the intensity and direction of light. Micromirror devices have various applications in video projection, microscopy, and optics.

SUMMARY

Disclosed are MEMS mirror arrays and methods of manufacturing the arrays that reduce coupling between adjacent mirrors in the array.

A microelectromechanical (MEM) array may comprise: a first stage comprising a first stage reflective surface; a second stage comprising a second stage reflective surface; a base wafer positioned below the first stage and the second stage; and a first frame pivotally coupled to the first stage. The first frame may be pivotally coupled to a second frame comprising a second frame high aspect ratio (AR) member that may be operable to reduce a mechanical motion of the second stage. The mechanical motion may comprise harmonic resonance. The second frame high AR member may be positioned to be in contact with a mirror cavity wall of the first stage. The contact between the second frame high AR member and the mirror cavity wall may be operable to reduce the mechanical motion of the second stage.

The second frame may comprise an additional second frame high AR member. The additional second frame high AR member may be positioned to be in contact with a mirror cavity wall of the first stage. The contact between the additional second frame high AR member and the mirror cavity wall may be operable to reduce the mechanical motion of the second stage. The additional second frame high AR member may be substantially parallel to the second frame high AR member. The second frame high AR member and the additional second frame AR member may have overlapping x-axis coordinates. The second frame may comprise one or more side-flanking members. The one or more side-flanking members may be substantially perpendicular to the second frame high AR member. The second frame may be substantially free of apertures.

The second frame high AR member may be positioned to be in contact with a mirror cavity wall of the first stage, and the first frame may be pivotally coupled to: a third frame comprising a third frame high AR member positioned to be in contact with the mirror cavity wall, a fourth frame comprising a fourth frame high AR member positioned to be in contact with the mirror cavity wall, and a fifth frame comprising a fifth frame high AR member positioned to be in contact with the mirror cavity wall. The base wafer may comprise a support anchor operable to reduce mechanical motion of the second stage. The second frame may be a stationary frame. The base wafer may comprise a silicon wafer. The first stage reflective surface may have a first resonant frequency. The second stage reflective surface may have a second resonant frequency.

A microelectromechanical (MEM) actuator array may comprise: a first stage comprising a first stage reflective surface; a second stage comprising a second stage reflective surface; a base wafer positioned below the first stage and the second stage; and a first frame pivotally coupled to the first stage. The first frame may be pivotally coupled to a first stationary frame. The first stationary frame may be coupled to a first stationary frame support anchor that may be operable to reduce mechanical motion of the second stage. The first stationary frame AR member may be positioned to be in contact with a mirror cavity wall of the first stage.

The MEM actuator may comprise an additional first stationary frame AR member may be positioned to be in contact with the mirror cavity wall of the first stage. The additional first stationary frame AR member may be substantially parallel to the first stationary frame high AR member. The additional first stationary frame AR member and the first stationary frame AR member may have overlapping x-axis coordinates. The first stationary frame may comprise one or more side-flanking members. The one or more side-flanking members may be substantially perpendicular to the first stationary frame high AR member. The first stationary frame may be substantially free of apertures. The base wafer may comprise a support anchor positioned between the first stage and the second stage to reduce mechanical motion of the second stage.

The MEM actuator may comprise: a second stationary frame that may be coupled to a second stationary frame support anchor that may be operable to reduce mechanical motion of a third stage; a third stationary frame that may be coupled to a third stationary frame support anchor that may be operable to reduce mechanical motion of a fourth stage, and a fourth stationary frame that may be coupled to a fourth stationary frame support anchor that may be operable to reduce mechanical motion of a fifth stage.

A method for reducing coupling between adjacent stages in a microelectromechanical (MEM) array may comprise: coupling a moveable frame to a stage with a reflective surface, and a stationary frame; and reducing a transfer of mechanical motion from the stage to an adjacent stage by one or more of: coupling one or more stationary frame high aspect ratio (AR) members to the stationary frame, or coupling one or more stationary frame support anchors to the stationary frame. The one or more stationary frame high aspect ratio (AR) members may be positioned to contact a mirror cavity wall. The one or more stationary frame support anchors have a selected surface area that is oriented towards a surface area of one or more side flanking members of the stationary frame. The stationary frame may comprise one or more side-flanking members that may be substantially perpendicular to the one or more stationary frame high AR members. The stationary frame may be substantially free of apertures.

A method for fabricating a microelectromechanical (MEM) array may comprise: forming a layer of dielectric material on a first side of a substrate; forming on the first side of the substrate vertical isolation trenches containing dielectric material; patterning a masking layer on a second side of the substrate that is opposite to the first side of the substrate; forming vias on the first side of the substrate; metallizing the first side of the substrate; depositing a second metal layer on the first side of the substrate to form a reflective surface; forming second trenches on the first side of the substrate to define structures; deeply etching the second side of the substrate to form narrow blades; bonding a base wafer to the second side of the substrate after forming the narrow blades; and etching through the second trenches on the first side of the substrate to release the structures and to provide electrical isolation. The method may comprise forming a passivation dielectric layer on the first side of the substrate after metallizing the first side of the substrate. The MEM array may comprise: a first stage comprising a first stage reflective surface; a second stage comprising a second stage reflective surface; a base wafer positioned below the first stage and the second stage; and a first frame pivotally coupled to the first stage, wherein the first frame is pivotally coupled to a second frame comprising one or more of: a second frame high aspect ratio (AR) member, or a second frame support anchor. The substrate may comprise a silicon wafer. The dielectric may be silicon dioxide.

The foregoing general description and the following detailed description are exemplary and explanatory only and are not restrictive of the disclosed embodiments, as claimed.

INCORPORATION BY REFERENCE

All publications, patents, and patent applications mentioned in this specification are herein incorporated by reference to the same extent as if each individual publication, patent, or patent application was specifically and individually indicated to be incorporated by reference.

U.S. Pat. No. 3,493,820 A dated Feb. 3, 1970 by Rosvold;
U.S. Pat. No. 4,104,086 A dated Aug. 1, 1978 by Bondur et al.;
U.S. Pat. No. 4,421,381 A dated Dec. 20, 1983 by Ueda et al.;
U.S. Pat. No. 4,509,249 A dated Apr. 9, 1985 by Goto et al.;
U.S. Pat. No. 4,519,128 A dated May 28, 1985 by Chesebro et al.;
U.S. Pat. No. 4,553,436 A dated Nov. 19, 1985 by Hansson;
U.S. Pat. No. 4,571,819 A dated Feb. 25, 1986 by Rogers et al.;
U.S. Pat. No. 4,670,092 A dated Jun. 2, 1987 by Motamedi;
U.S. Pat. No. 4,688,069 A dated Aug. 18, 1987 by Joy et al.;
U.S. Pat. No. 4,706,374 A dated Nov. 17, 1987 by Murakami;
U.S. Pat. No. 4,784,720 A dated Nov. 15, 1988 by Douglas;
U.S. Pat. No. 4,855,017 A dated Aug. 8, 1989 by Douglas;
U.S. Pat. No. 4,876,217 A dated Oct. 24, 1989 by Zdebel;
U.S. Pat. No. 5,068,203 A dated Nov. 26, 1991 by Logsdon et al.;
U.S. Pat. No. 5,083,857 A dated Jan. 28, 1992 by Hornbeck;
U.S. Pat. No. 5,097,354 A dated Mar. 17, 1992 by Goto;
U.S. Pat. No. 5,172,262 A dated Dec. 15, 1992 by Hornbeck;
U.S. Pat. No. 5,198,390 A dated Mar. 30, 1993 by MacDonald et al.;
U.S. Pat. No. 5,203,208 A dated Apr. 20, 1993 by Bernstein;
U.S. Pat. No. 5,226,321 A dated Jul. 13, 1993 by Varnham et al.;
U.S. Pat. No. 5,235,187 A dated Aug. 10, 1993 by Arney et al.;
U.S. Pat. No. 5,316,979 A dated May 31, 1994 by MacDonald et al.;
U.S. Pat. No. 5,393,375 A dated Feb. 28, 1995 by MacDonald et al.;
U.S. Pat. No. 5,397,904 A dated Mar. 14, 1995 by Arney et al.;
U.S. Pat. No. 5,399,415 A dated Mar. 21, 1995 by Chen et al.;
U.S. Pat. No. 5,426,070 A dated Jun. 20, 1995 by Shaw et al.;
U.S. Pat. No. 5,427,975 A dated Jun. 27, 1995 by Sparks et al.;
U.S. Pat. No. 5,428,259 A dated Jun. 27, 1995 by Suzuki;
U.S. Pat. No. 5,449,903 A dated Sep. 12, 1995 by Arney et al.;
U.S. Pat. No. 5,454,906 A dated Oct. 3, 1995 by Baker et al.;
U.S. Pat. No. 5,488,862 A dated Feb. 6, 1996 by Neukermans et al.;
U.S. Pat. No. 5,501,893 A dated Mar. 26, 1996 by Laermer et al.;
U.S. Pat. No. 5,536,988 A dated Jul. 16, 1996 by Zhang et al.;
U.S. Pat. No. 5,563,343 A dated Oct. 8, 1996 by Shaw et al.;
U.S. Pat. No. 5,610,335 A dated Mar. 11, 1997 by Shaw et al.;
U.S. Pat. No. 5,611,888 A dated Mar. 18, 1997 by Bosch et al.;
U.S. Pat. No. 5,611,940 A dated Mar. 18, 1997 by Zettler;
U.S. Pat. No. 5,628,917 A dated May 13, 1997 by MacDonald et al.;
U.S. Pat. No. 5,629,790 A dated May 13, 1997 by Neukermans et al.;
U.S. Pat. No. 5,637,189 A dated Jun. 10, 1997 by Peeters et al.;
U.S. Pat. No. 5,645,684 A dated Jul. 8, 1997 by Keller;
U.S. Pat. No. 5,673,139 A dated Sep. 30, 1997 by Johnson;
U.S. Pat. No. 5,703,728 A dated Dec. 30, 1997 by Smith et al.;
U.S. Pat. No. 5,719,073 A dated Feb. 17, 1998 by Shaw et al.;
U.S. Pat. No. 5,726,073 A dated Mar. 10, 1998 by Zhang et al.;
U.S. Pat. No. 5,759,913 A dated Jun. 2, 1998 by Fulford Jr et al.;
U.S. Pat. No. 5,770,465 A dated Jun. 23, 1998 by MacDonald et al.;
U.S. Pat. No. 5,798,557 A dated Aug. 25, 1998 by Salatino et al.;
U.S. Pat. No. 5,804,084 A dated Sep. 8, 1998 by Nasby et al.;
U.S. Pat. No. 5,846,849 A dated Dec. 8, 1998 by Shaw et al.;
U.S. Pat. No. 5,847,454 A dated Dec. 8, 1998 by Shaw et al.;
U.S. Pat. No. 5,853,959 A dated Dec. 29, 1998 by Brand et al.;
U.S. Pat. No. 5,915,168 A dated Jun. 22, 1999 by Salatino et al.;
U.S. Pat. No. 5,920,417 A dated Jul. 6, 1999 by Johnson;
U.S. Pat. No. 5,933,746 A dated Aug. 3, 1999 by Begley et al.;
U.S. Pat. No. 5,969,848 A dated Oct. 19, 1999 by Lee et al.;
U.S. Pat. No. 5,998,816 A dated Dec. 7, 1999 by Nakaki et al.;
U.S. Pat. No. 5,998,906 A dated Dec. 7, 1999 by Jerman et al.;
U.S. Pat. No. 5,999,303 A dated Dec. 7, 1999 by Drake;
U.S. Pat. No. 6,000,280 A dated Dec. 14, 1999 by Miller et al.;
U.S. Pat. No. 6,020,272 A dated Feb. 1, 2000 by Fleming;
U.S. Pat. No. 6,044,705 A dated Apr. 4, 2000 by Neukermans et al.;
U.S. Pat. No. 6,072,617 A dated Jun. 6, 2000 by Henck;
U.S. Pat. No. 6,075,639 A dated Jun. 13, 2000 by Kino et al.;
U.S. Pat. No. 6,097,858 A dated Aug. 1, 2000 by Laor;
U.S. Pat. No. 6,097,859 A dated Aug. 1, 2000 by Solgaard et al.;
U.S. Pat. No. 6,097,860 A dated Aug. 1, 2000 by Laor;
U.S. Pat. No. 6,101,299 A dated Aug. 8, 2000 by Laor;

U.S. Pat. No. 6,121,552 A dated Sep. 19, 2000 by Brosnihan et al.;
U.S. Pat. No. 6,307,452 B1 issued Oct. 23, 2001 to Sun;
U.S. Pat. No. 6,753,638 A dated Feb. 2, 2001 by Adams et al.;
U.S. Pat. No. 6,921,952 B2 issued Jul. 26, 2005 to Jeong;
U.S. Pat. No. 7,098,571 A dated Aug. 29, 2006 by Adams, et al.;
U.S. Pat. No. 7,261,826 B2 dated Aug. 28, 2007 by Adams et al.;
U.S. Pat. No. 8,705,159 B2 issued Apr. 22, 2014 to Lee;
U.S. Pat. No. 8,904,866 B2 issued Dec. 9, 2014 to Hammer;
U.S. Pat. No. 9,237,402 B2 issued Jan. 12, 2016 to Loeppert;
U.S. Pat. No. 10,190,938 B2 issued Jan. 29, 2019 to Blomqvist et al.;
U.S. Pat. No. 11,186,478 B2 issued Nov. 30, 2021 to Langa et al.;
US 2008/190198 A1 dated Aug. 14, 2008 by Prandi et al.;
US 2008/284028 A1 dated Nov. 20, 2008 by Greywall;
US 2009/196623 A1 dated Aug. 6, 2009 by Detry;
US 2010/263998 A1 dated Oct. 21, 2010 by Anderson et al.;
US 2011/018095 A1 dated Jan. 27, 2011 by Booth Jr., et al.;
US 2011/140569 A1 dated Jun. 16, 2011 by Moidu;
US 2012/133023 A1 dated May 31, 2012 by Booth Jr., et al.;
US 2013/0147313 A1 published Jun. 13, 2013 to Sachse;
US 2014/014480 A1 dated Jan. 16, 2014 by Anderson et al.;
US 2019/0345023 A1 published Nov. 14, 2019 to Duerr et al.;
WO 1994/018697 A1 dated Aug. 18, 1994 by Shaw et al.;
WO 1997/004283 A2 dated Feb. 6, 1997 by Miller et al.; and
WO 1999/036941 A2 dated Jul. 22, 1999 by Adams et al.
WO 2001/057902 A2 dated Aug. 9, 2001 by Adams et al.;
WO 2022/010349 A1 published Jan. 13, 2022 to Lierop;
KOTA, et al., Design of Compliant Mechanisms: Applications to MEMS (Dec. 31, 2001);
SAAD, et al., Analysis of MEMS mechanical spring for coupling multimodal micro resonators sensor (Dec. 10, 2008); and
ZHANG, et al., Buckling analysis of planar compression micro-springs (Feb. 6, 2015).

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

DETAILED DESCRIPTION

Figure 1A:
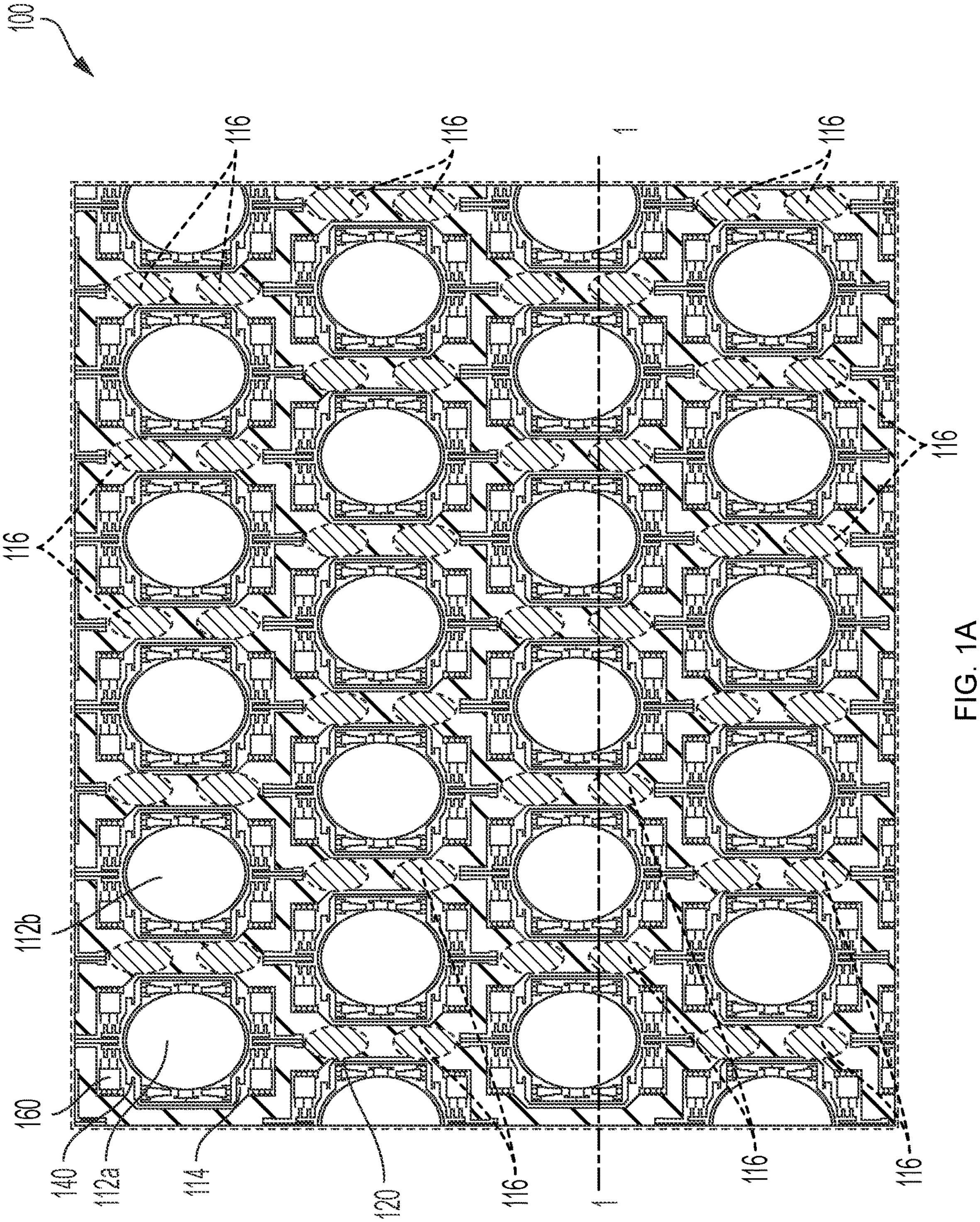
FIG. 1A illustrates a portion of a micromirror array.

Microelectromechanical systems (MEMS), when voltage is applied between two electrode plates, may generate an attractive force that may cause rotation. The maximum rotation may be determined by the gaps between the two electrode plates. As the size of the gap between the two electrode plates increases, a higher voltage is used to achieve the same force. Consequently, the voltage used to move the electrode plates may be high, nonlinear, and in flux.

To cause rotation, MEMS may include a released structure which has: (i) a high aspect ratio (AR) member in which a longitudinal length of the member is a least five times larger than a transverse length of the member, or (ii) a member spaced apart from another structure by a gap defining a space with a high AR. High AR members and/or associated gaps may be useful for providing large capacitances. In the case of an electrostatic motor, a high capacitance may facilitate a high electrostatic force between the released structure and a surrounding drive electrode. A high electrostatic force allows the released structure to be actuated over a large distance or a larger angle at a lower applied voltage which is operable to enhance electrostatic motor performance. For MEMS implementations that do not use a large actuation angle, a high electrostatic force allows flexures to be mechanically stiffer to increase the resonant frequency of the released structure and overall reliability of the device in an operating environment.

The fill factor may impact a MEMS. For a micromirror array the fill factor may be a ratio of the active reflecting area to the total contiguous area occupied by the mirror array. To maximize the fill factor, high aspect ratio members having a first dimension and a second dimension with one of the two dimensions being longer than the other dimension. The high aspect ratio members may be suspended with their longest dimensions oriented perpendicularly to the surface of the mirror, as is described for actuator members in commonly assigned U.S. Pat. No. 6,753,638.

For micromirrors that increase the size of the gap, and thereby increase the electrostatic forces used, or that increase the fill factor, and thereby decrease the distance between neighboring micromirrors, coupling between different micromirrors may result when a particular micromirror moves. Placing support anchors in between mirrors reduces coupling, but more reduction is possible. Further coupling (e.g., crosstalk) due to the torque applied at the fixed electrodes may be reduced by one or more of: (i) configuring one or more high AR members to contact a mirror cavity wall (ii) adding an additional anchor near the electrodes, (iii) orienting one or more high AR members perpendicular to one or more side-flanking members, or the like.

A MEM array may comprise a first stage comprising a first stage reflective surface (e.g., which may have a first resonant frequency), and a second stage comprising a second stage reflective surface (e.g., which may have a second resonant frequency). The MEM array may comprise a base wafer (e.g., a silicon wafer) positioned below the first stage and the second stage; and a first frame pivotally coupled to the first stage. The first frame may be pivotally coupled to a second frame (e.g., a stationary frame), which may comprise a second frame high AR member. The second frame high AR member may be operable to reduce mechanical motion (e.g., harmonic amplitude of vibration) of the second stage.

A MEM actuator may comprise: a first stage comprising a first stage reflective surface; and a first frame pivotally coupled to the first stage. The MEM actuator may comprise a second stage comprising a second stage reflective surface. The MEM actuator may comprise a base wafer positioned below the first stage and the second stage. The first frame may be pivotally coupled to a first stationary frame, which may comprise a first stationary frame support anchor that may be operable to reduce mechanical motion of a second stage.

A method for reducing coupling between adjacent stages in a MEM array may comprise: coupling a moveable frame to: a stage including a reflective surface, and a stationary frame; and reducing a transfer of mechanical motion from the stage to an adjacent stage by one or more of: coupling one or more stationary frame high AR members to the stationary frame, or coupling one or more stationary frame support anchors to the stationary frame.

Methods are provided for fabricating a MEM array as disclosed herein.

I. Microelectromechanical (MEM) Arrays

FIG. 1A illustrates an upper layer view portion of a MEM array 100 for an array of micromirror electrostatic actuators (e.g., mirror cells). The MEM array 100 may comprise a first stage 112*a* (e.g., a central stage), which may comprise a first stage reflective surface (e.g., a metal layer which may be operable as a mirror and which may have a first resonant frequency). The MEM array 100 may comprise a second stage 112*b* (e.g., a central stage of a different mirror cell), which may comprise a second stage reflective surface (e.g., a metal layer which may be operable as a mirror and which may have a second resonant frequency). The first stage 112*a* may be pivotally coupled to a first frame (e.g., a moveable frame 140). The first frame (e.g., a moveable frame 140) may be pivotally coupled to a second frame (e.g., a first stationary frame 160). The MEM array 100 may have a mirror cavity 114, and a support 120. The MEM array 100 may comprise a support anchor 116 (e.g., a support anchor 212*b* as illustrated in FIG. 2B).

Figure 1B:
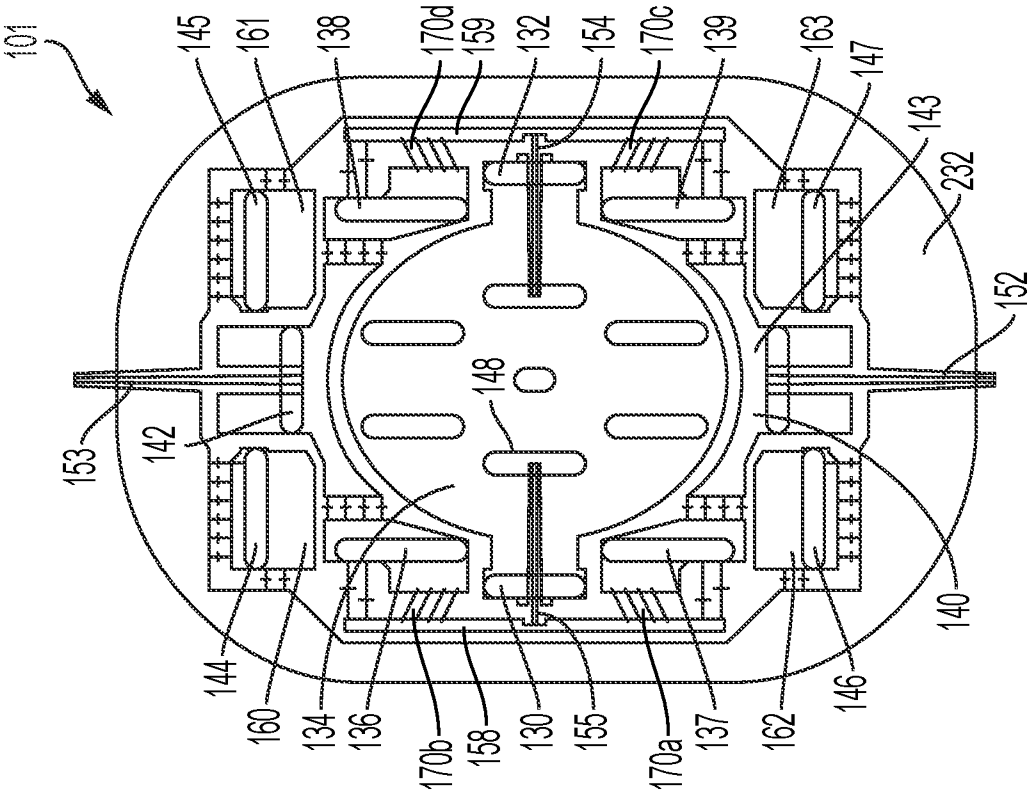
FIG. 1B is a plan view of a micromirror and surrounding structure.

FIG. 1B illustrates a plan view of an undersurface of a micromirror electrostatic actuator 101. The side-flanking members (e.g., 136, 137, 138, 139) may have a length and a width in a planar view with an orientation in a first direction or a second direction where the orientation of the side-flanking member (e.g., 136, 137, 138, 139) may be, for example, perpendicular or parallel to another MEM component, such as another side-flanking member (e.g., 136, 137, 138, 139). The side-flanking members (e.g., 136, 137, 138, 139) may also be provided in pairs.

The pair of first high aspect ratio members 130, 132 may be coupled to central stage 134. A first pair of side-flanking members 136, 137 (e.g., high aspect ratio side flanking members), may be coupled to moveable frame 140 on opposite ends of the first high aspect ratio member 130 of the first pair. The first pair of high aspect ratio side-flanking members 136, 137 are oriented in the same direction as the first high aspect ratio member 130. A second pair of side-flanking members 138, 139 (e.g., high aspect ratio side-flanking members) may be coupled to the moveable frame 140 on opposite ends of the second high aspect ratio member 132. The second pair of side-flanking members 138, 139 (e.g., high aspect ratio side-flanking members) may also be oriented in the same direction as second high aspect ratio member 132.

A second pair of high aspect ratio members 142, 143 may be coupled on opposite ends of moveable frame 140. The second pair of high aspect ratio members 142, 143 may be oriented perpendicularly to the first high aspect ratio member 130. The second pair of high aspect ratio member 142, 143 may have a first pair of side-flanking members 144, 145, and a second pair of side-flanking members 146, 147 coupled respectively to stationary frames 160, 161 162, 163 (e.g., first stationary frame 160, second stationary frame 161, third stationary frame 162, and fourth stationary frame 163). The first pair 144, 145 and second pair 146, 147 of the high aspect ratio side flanking members of the first high aspect ratio member may be oriented perpendicular to the first pair and second pair of the high aspect ratio side flanking members of the second high aspect ratio member. Additional high aspect ratio members (e.g., high aspect ratio member 148) may be coupled to the undersurface of central stage 134 to reduce etch depth variations across the device (e.g., as a result of etch loading, or the like). High aspect ratio members (e.g., high aspect ratio member 148) may provide mechanical stiffening and reduce top surface distortions.

At an end of a stage or frame, micromirror electrostatic actuator 101 may use a moveable member such as the first high aspect ratio member 130 in FIG. 1B, with the pair of the first side-flanking members 136, 137 (e.g., two first side-flanking members) to enable rotation. Micromirror electrostatic actuator 101 may use two side-flanking members per stage and two side-flanking members per frame. The central stage 134 may be pivotally coupled to moveable frame 140 such that first high aspect ratio member 130 may be operable to move relative to first side-flanking members 136, 137. When a potential difference is applied between first high aspect ratio member 130 and one of the first side-flanking members 136, 137, an attraction may be generated between the members causing the central stage 134 to pivot. For example, first high aspect ratio member 130 may be held at a ground potential while an active voltage is applied to either of the first side-flanking members 136, 137. The application of an active voltage to first side-flanking member 136, for example, may attract the first high aspect ratio member 130, and may cause the central stage 134 to rotate in a corresponding direction. Similarly, the application of an active voltage to first side-flanking member 137 may attract first high aspect ratio member 130 and may cause the central stage 134 to rotate in an opposite direction from the direction resulting from the attraction to first side-flanking member 136.

Likewise, second high aspect ratio member 132 may move relative to second side-flanking members 138, 139. In order to provide the desired motion of central stage 134 and to resist unwanted rotations, actuation voltages may be applied concurrently with respect to first high aspect ratio member 130 and second high aspect ratio member 132. When the potential difference is applied between the second high aspect ratio member 132 and one of second side-flanking members 138, 139, an attraction may be generated between the members (i.e., between 132 and one of 138 or 139) resulting in the rotation of central stage 134 in a manner similar to that discussed above with respect to the first high aspect ratio member 130. The use of actuation structures, e.g., first side-flanking members 136, 137 or second side-flanking members 138, 139, in tandem on an end of central stage 134 may minimize undesired twisting of the central stage 134 to provide for more uniform rotation.

An actuation structure, e.g., first side-flanking members 144, 145 or second side-flanking members 146, 147, may be used for rotation of the moveable frame 140. For example, a high aspect ratio member 142 may be coupled to moveable frame 140 and a first pair of side-flanking members 144, 145 may be coupled to stationary frames 160, 161, respectively, on opposite ends of the high aspect ratio member 142.

Moveable frame 140 is pivotally coupled to stationary frames 160 such that high aspect ratio member 142 is operable to move relative to first pair of side-flanking members 144, 145. When a potential difference is applied between the high aspect ratio member 142 and one of the side-flanking members of the first pair of side-flanking members 144, 145, an attraction may be generated between the members (e.g., between high aspect ratio member 142 and one of the side-flanking members of the first pair of side-flanking members 144, 145) which may cause the moveable frame 140 to pivot in a manner similar to that discussed above in relation to central stage 134.

High aspect ratio member 143 may move relative to a second pair of side-flanking members 146, 147. When a potential difference is applied between high aspect ratio member 143 and one of the side-flanking members of the second pair of side-flanking members 146, 147, an attraction may be generated between the members (e.g., between high aspect ratio member 143 and one of side-flanking members of the second pair of side-flanking members 146, 147) which may facilitate the rotation of the moveable frame 140. The use of actuation structures in tandem on an end of the moveable frame 140 may minimize undesired twisting of the frame to provide for more uniform rotation.

Alternatively or in addition, a central stage 134 or frame (e.g., moveable frame 140 or stationary frames 160, 161, 162, 163) may have an actuation structure, e.g., first side-flanking members 136, 137 or second side-flanking members 138, 139, on one end. Alternatively or in addition, micromirror electrostatic actuator 101 may have other actuation structures, which may be configured to minimize undesired twisting, without departing from the scope of the disclosure.

A MEM array 100 (as illustrated in FIG. 1A) may comprise a plurality of stages (e.g., micromirror electrostatic actuators 101 (as illustrated in FIG. 1B)). A micromirror electrostatic actuator 101 in an array may include a central stage 134, a moveable frame 140, and a stationary frame 160. The stationary frame 160 may form a cavity in which the central stage 134 and the moveable frame 140 may be disposed. A reflective surface (e.g., a metal layer which may be operable as a mirror and which may have a first resonant frequency) may be coupled to the central stage 134 and suspended from the moveable frame 140 by a first central stage flexure 154 and a second central stage flexure 155. The reflective surface may be used to redirect a light beam along an optical path that may be a different optical path from the optical path of the received light beam. An actuator that includes a mirror on the central stage 134 may be referred to herein as a mirror cell, a MEM actuator with a mirror, or a micromirror electrostatic actuator 101.

The rotation of the central stage 134 may be independent of the rotation of the moveable frame 140 so that a micromirror electrostatic actuator 101 may allow decoupled motion. For example, central stage 134 may rotate with respect to a stationary frame 160, 161, 162, 163 while moveable frame 140 may remain parallel and stationary on the MEM structure with respect to stationary frame 160, 161, 162, 163. Alternatively or in addition, moveable frame 140 may rotate with respect to the stationary frame 160, 161, 162, 163 while the central stage 134 may remain parallel (and stationary) with respect to the moveable frame 140 on the MEM structure. The moveable frame 140 may couple to the stationary frame 160, 161, 162, 163 via a first stationary frame flexure 152 and a second stationary frame flexure 153. Alternatively or in addition, the central stage 134 and the moveable frame 140 may, for example, rotate concurrently and independently of each other. Thus, for example, the central stage 134, moveable frame 140, and stationary frame 160 may concurrently be non-parallel and decoupled with respect to each other during actuation.

The first central stage flexure 154 and the second central stage flexure 155 may be coupled to the moveable frame 140 via a first end bar 158 and a second end bar 159. The first end bar and the second end bar may be attached to the moveable frame 140 using one or more sets of support beams 170*a*, 170*b*, 170*c*, 170*d*. One or more sets of support beams 170*a*, 170*b*, 170*c*, 170*d* may be comprised in whole or in part of silicon dioxide configured to facilitate a selected amount of tension. The one or more sets of support beams 170*a*, 170*b*, 170*c*, 170*d* may facilitate application of a selected amount of tension to the structure by expanding a different amount when compared to the material used in e.g., the moveable frame 140, the central stage 134, the first end bar 158, the second end bar 159, or the stationary frame 160, 161, 162, 163. Materials of differing expansion qualities may be used in the moveable frame 140 to facilitate a suitable amount of tension for the first central stage flexure 154 and for the second central stage flexure 155.

In particular, the expansion provided by connection beams acting against the moveable frame 140 and the first and second end bars may cause: (i) tension between a pair of the central stage flexure 154, 155 and (ii) tension between a pair of the stationary frame flexure 152, 153. One or more sets of support beams 170*a*, 170*b*, 170*c*, 170*d* may be configured to apply tension to minimize positional distortions due to buckling of the flexures (e.g., the central stage flexures 154, 155 or stationary frame flexures 152, 153) under compressive forces. Generally, when the flexures (e.g., the central stage flexures 154, 155 or stationary frame flexures 152, 153) are under a compressive force that exceeds a threshold, the flexures (e.g., the central stage flexures 154, 155 or stationary frame flexures 152, 153) may buckle.

As such, one or more sets of support beams 170*a*, 170*b*, 170*c*, 170*d* may be coupled between the moveable frame 140 and the first end bar and the second end bar at a substantially non-perpendicular angle to pull on central stage flexures 154, 155 to facilitate tension. Because the stationary frame flexures 152, 153 may be perpendicular to the central stage flexures 154, 155, the substantially non-perpendicular angle of attachment of the support beams may cause a pull on the moveable frame 140 which may pull on and facilitate tension for the stationary frame flexures 152, 153. One or more sets of support beams 170*a*, 170*b*, 170*c*, 170*d* may be coupled between: (i) the moveable frame 140 and (ii) the first and/or second end bars 158, 159 at an angle of approximately degrees (e.g., in a range of from 35 degrees to 55 degrees). Alternatively or in addition, one or more sets of support beams 170*a*, 170*b*, 170*c*, 170*d* may be coupled between: (i) the moveable frame 140 and (ii) the first and/or second end bars 158, 159 at an angle of less than or greater than 45 degrees.

Central stage flexures 154, 155 may allow the central stage 134 to pivot. Central stage flexures 154, 155 may facilitate torsional resistance along a direction of the central stage flexures 154, 155, but may provide more resistance in other directions. In other words, there may be substantial resistance to undesired movement of the central stage in selected directions (e.g., side-to-side, or around an axis perpendicular to the surface of central stage).

Central stage flexures 154, 155 may extend into a corresponding slot formed in the central stage 134 to provide a sufficient length to the central stage flexures 154, 155 for appropriate flexibility and/or torsion resistance. The central stage flexures 154, 155 may have: a length of from about 10 microns to about 200 microns (e.g., approximately 100 microns); a height of from about 1 microns to about 20 microns (e.g., approximately 7 microns); and a width of from about 0.1 microns to about 2.0 microns (e.g., approximately 1 micron). The central stage flexures 154, 155 may have an aspect ratio of from about 5:1 to about 20:1 (e.g., about a 10:1 aspect ratio). Such an aspect ratio may provide for greater compliance in the direction of desired motion and stiffness in the undesired directions. Alternatively or in addition, other lengths, heights, widths, and aspect ratios may be used.

Similarly, stationary frame flexures 152, 153 may allow the moveable frame 140 to pivot while providing resistance to undesired movement of the moveable frame 140 in other directions (e.g., side-to-side, or around an axis perpendicular to the surface of moveable frame). Stationary frame flexures 152, 153 may extend into a pair of corresponding slots formed in the moveable frame 140 and stationary frame 160, 161, 162, 163 to provide a sufficient length for stationary frame flexures 152, 153 to facilitate appropriate flexibility and torsion resistance. The stationary frame flexures 152, 153 may have lengths, heights, widths, and aspect ratios similar to those disclosed for the central stage flexures 154, 155. Alternatively or in addition, other lengths, heights, widths, and aspect ratios may be used.

One or more of the central stage flexures 154, 155 or stationary frame flexures 152, 153 may comprise a pair of torsion beams. The pair of torsion beams may be non-parallel to each other. The use of multiple torsion beams (e.g., a pair, or a plurality) may facilitate increased resistance to undesired movement of a frame (e.g., a moveable frame 140) or stage (e.g., central stage 134) when compared to a single beam flexure.

A pair of torsion beams may have various configurations. Torsion beams may be non-parallel beams with ends near the moveable frame 140 that may be substantially parallel and spaced apart by a gap. The gap between torsion beams may be configured to be reduced along the length of the torsion beams such that the ends of the torsion beams near the stationary frame 160, 161, 162, 163 may be closer together than the ends of the beams near the moveable frame 140. The angling of torsion beams relative to each other may resist unstable twisting modes.

Alternatively or in addition, torsion beams may be configured such that the ends of the torsion beams near the stationary frame 160, 161, 162, 163 may be farther apart than the ends of the torsion beams near the moveable frame 140. Alternatively, the torsion beams may be substantially parallel to each other such that the gap between the torsion beams may be substantially uniform along the length of the torsion beams.

Figure 2A:
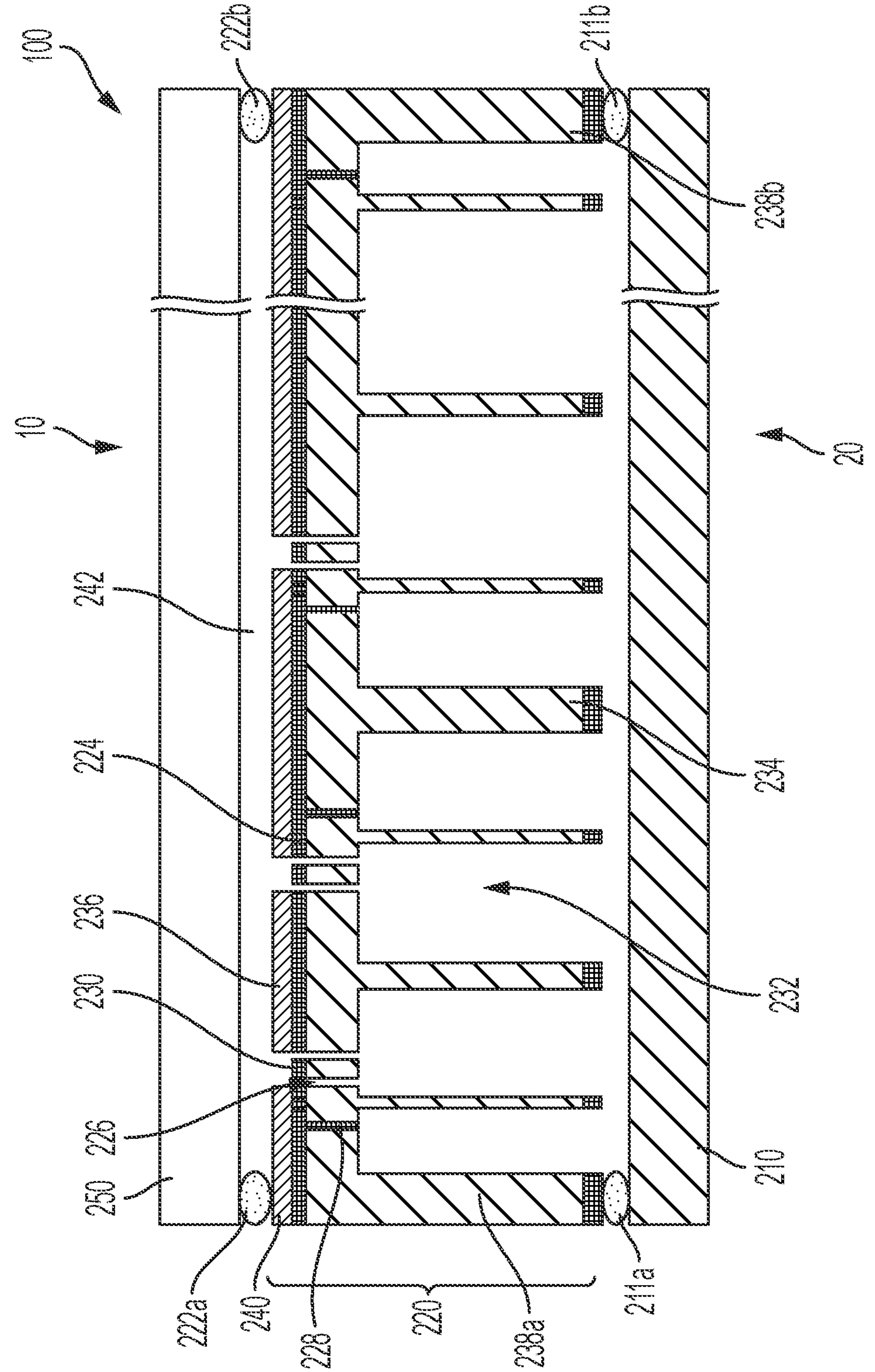
FIG. 2A-B illustrate cross-sections of variations of a micromirror array taken along the lines 1-1 in FIG. 1A.
Figure 2B:
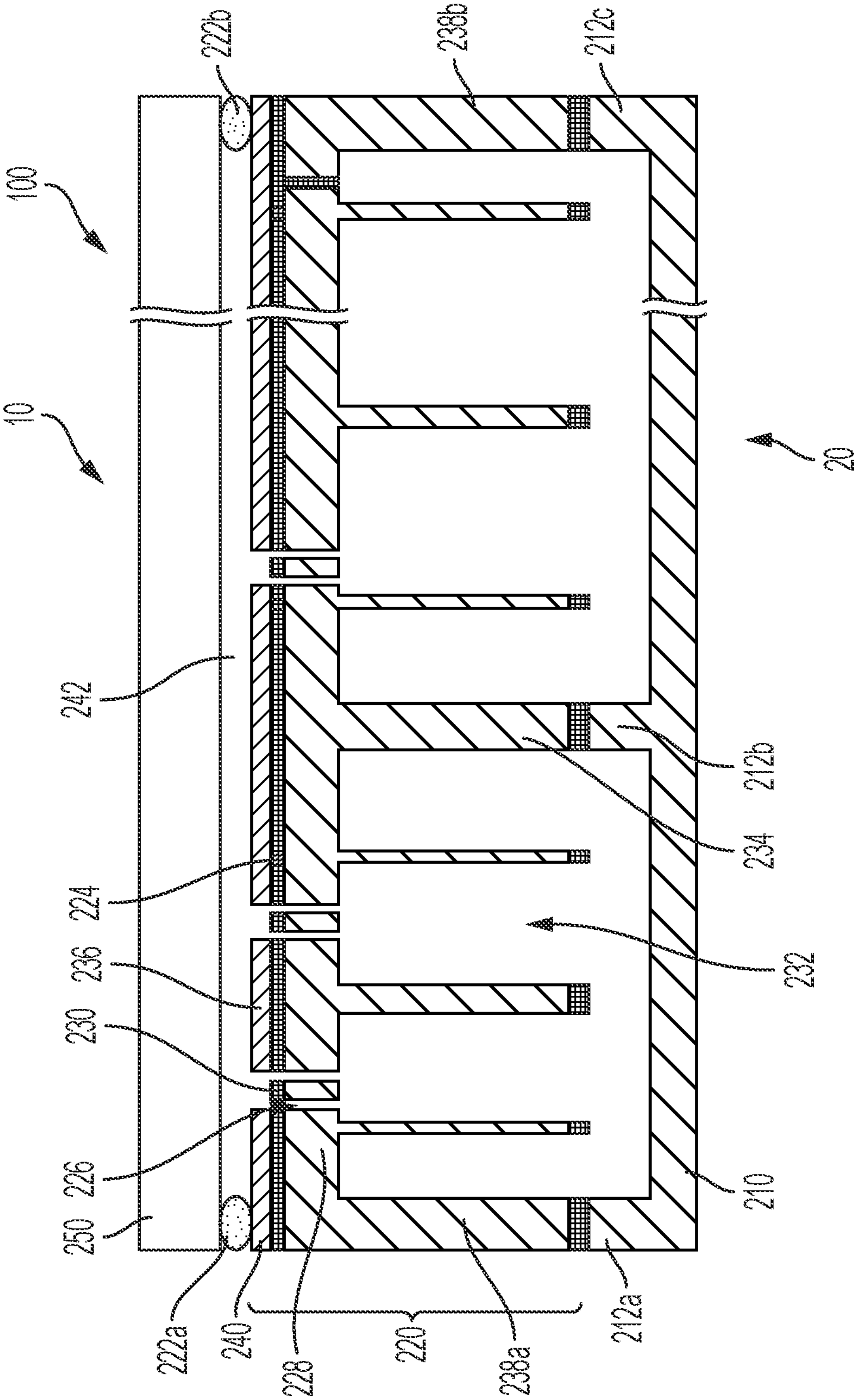
Figure 3A:
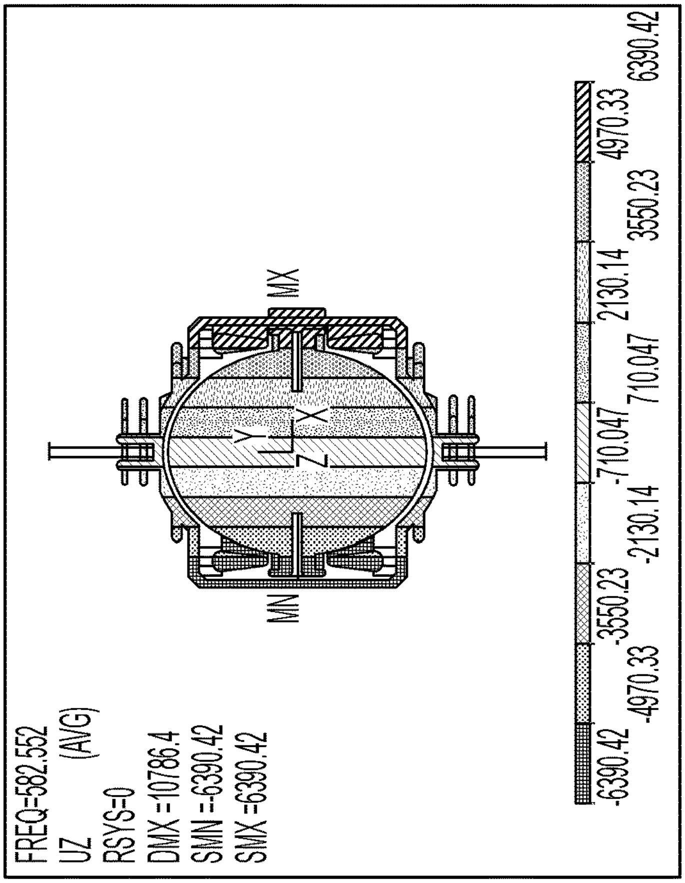
FIGS. 3A-H illustrate simulated modal analysis of micromirror.
Figure 3B:
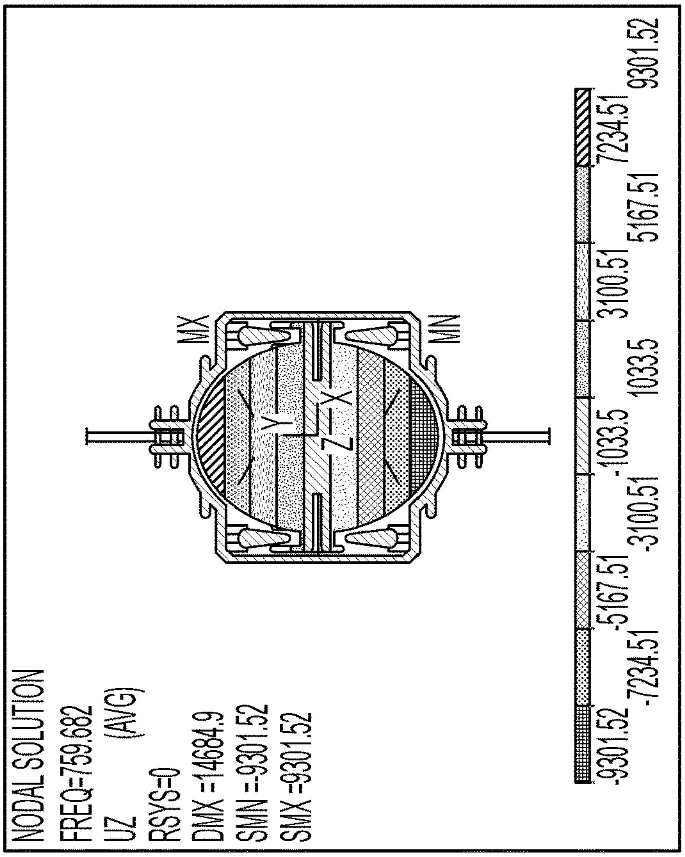
Figure 3C:
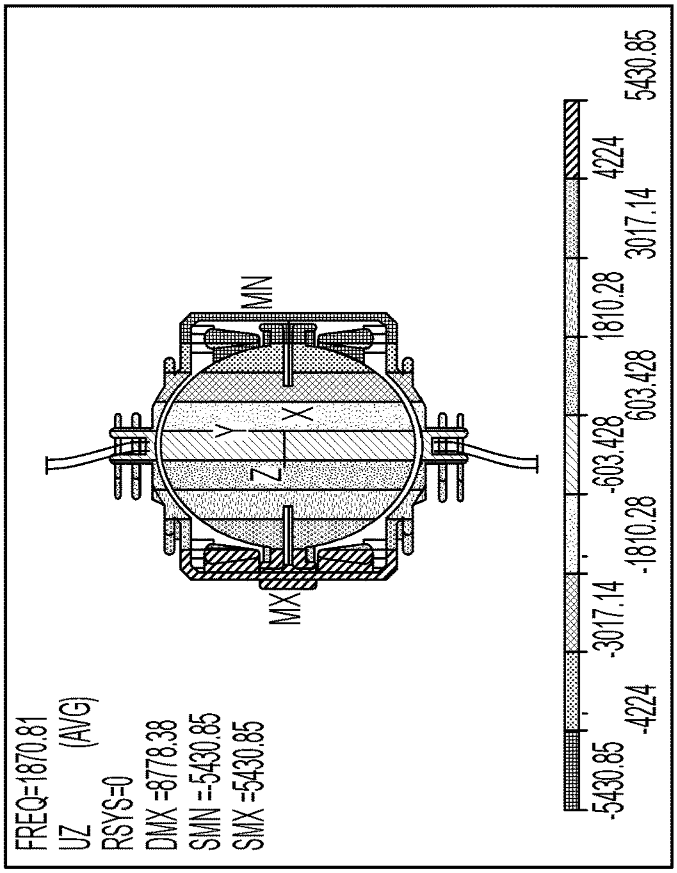
Figure 3D:
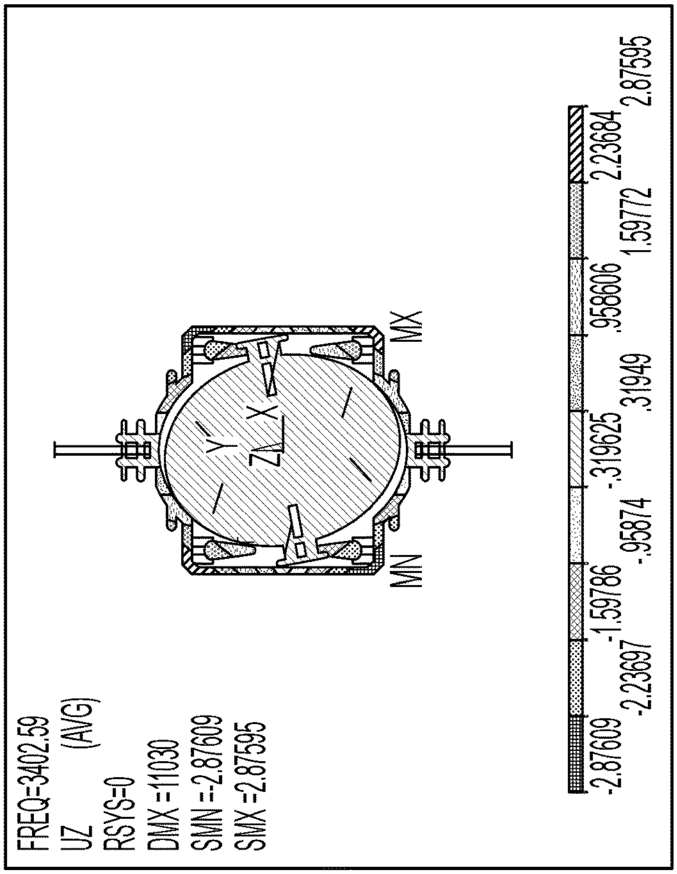
Figure 3E:
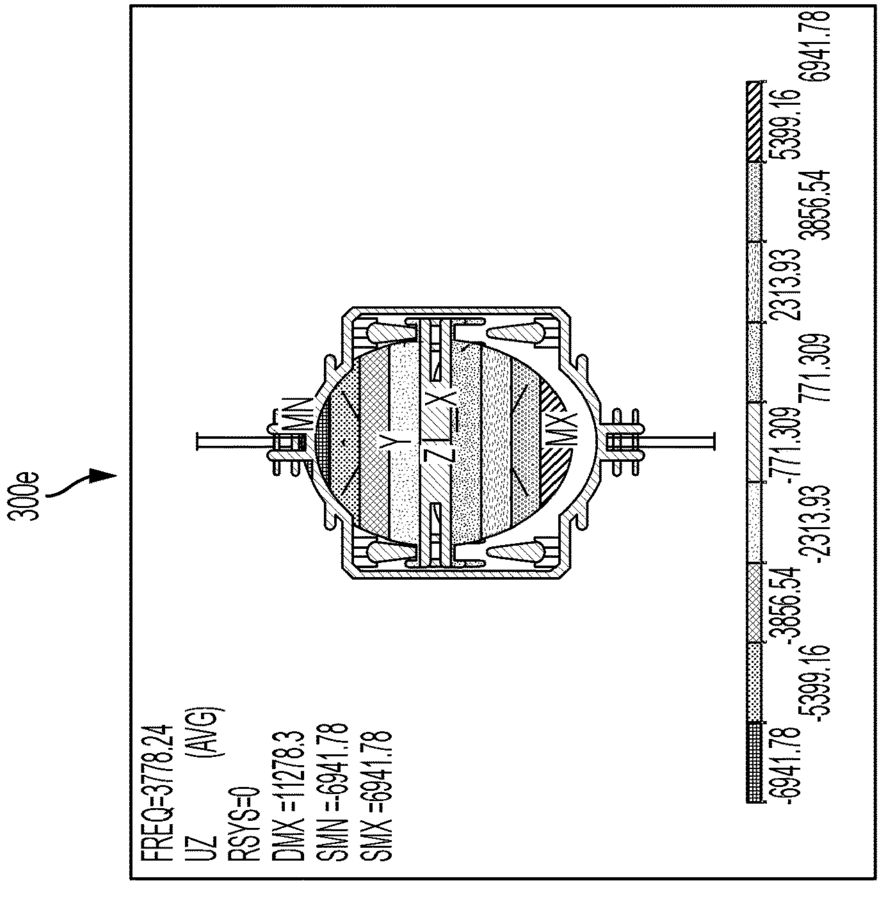
Figure 3F:
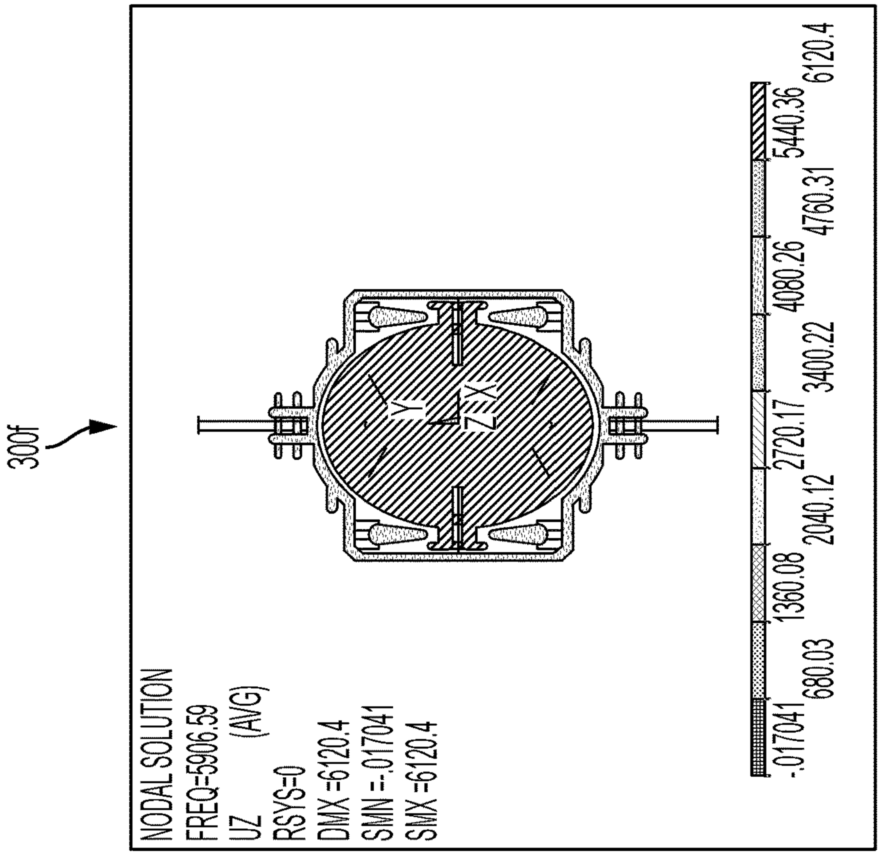
Figure 3G:
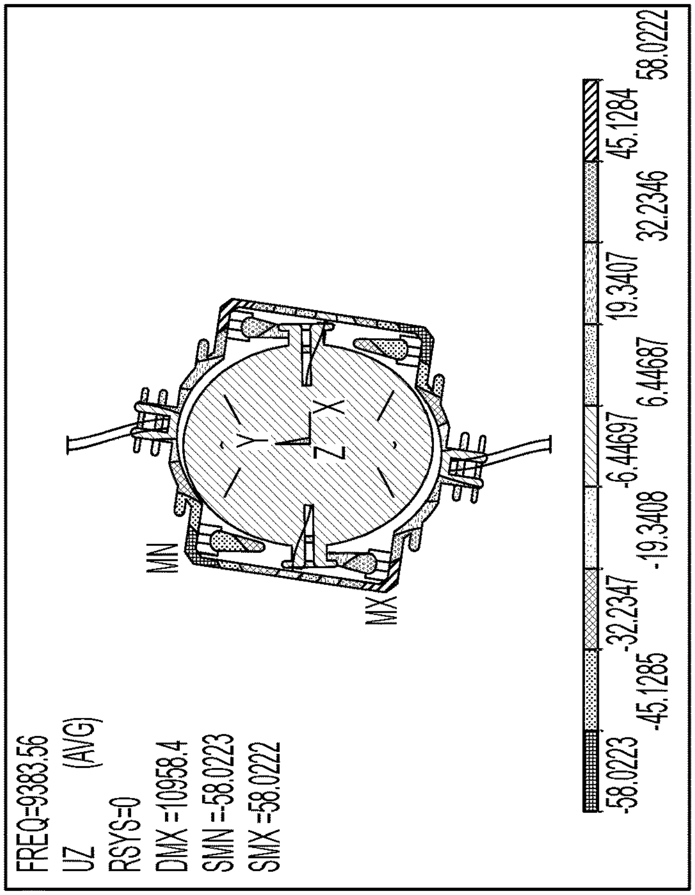
Figure 3H:
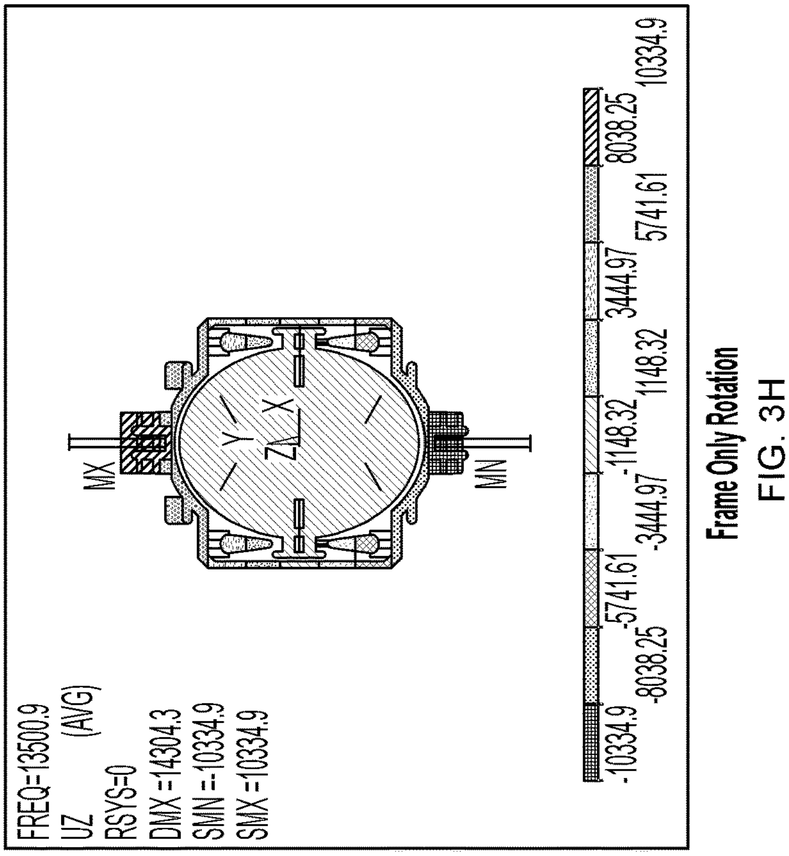

FIG. 2A illustrates a partial cross-section of a MEM array 100 taken along the lines 1-1 in FIG. 1 with a top side 10 and a bottom side 20 wherein layers within the MEM array 100 may have a layer top surface oriented towards a top side 10 and a layer bottom surface oriented towards bottom side 20. The MEM array 100 may comprise a silicon wafer 210, which may be a base wafer for the MEM array 100, and a lid wafer 250 which may be a protective layer. In some configurations, a pair of bonding elements 211*a*, 211*b* may be a frit glass seal at encircling the micromirror array to bond the device wafer 220 to the base wafer 210.

FIG. 2B illustrates a partial cross-section of a MEM array 100 taken along the lines 1-1 in FIG. 1 where the silicon wafer 210 may be bonded to the device wafer 220 using, for example, one or more of eutectic bonding, thermo-compression bonding, fusion bonding, or anodic bonding at 212*a* and 212*c*. The support anchors 212*b* (or the support pillars) and bonding surfaces 212*a* and 212*c* may be formed by etching pillars and/or posts having a height of from about 10 μm to about 100 μm into the silicon wafer 210. During the bonding process, the support anchors 212*b* may contact the support webbing 234. In some configurations, the support anchors 212*b* may bond to the support webbing 234. In other configurations, the support anchors 212*b* may be near but not in contact with the support webbing 234. The support webbing 234 may be below the support 120 (as illustrated 116 in FIG. 1A).

Structure release may be accomplished at the upper surface (e.g., the top side 10) of the device wafer 220 using dry etching, which may puncture through a plurality of trenches 226 to suspend the moveable structures of the central stage 236 (e.g., a mirror) and the frame 230. Isolation joints 228 may be formed by etching the front until the etch approaches or just reaches the mirror cavity 232.

Alternatively or in addition, the release etch may promote electrical isolation by separating, for example, the silicon of the frame 230 from the silicon of surrounding members 238*a*, 238*b*. The vias 224 may connect the regions of silicon to the metal interconnects 240. To seal the central stage 236 (e.g., mirrors) from the outside environment, a lid wafer 250 may be bonded to the device wafer 220, for example through the second pair of bonding elements 222*a*, 222*b* which may be a frit glass seal. The lid wafer 250 may be glass to allow incoming light to be: transmitted with low loss in the cavity 242 above the mirror, reflected off of the upper surface of central stage 236 (e.g., a mirror), and transmitted out of the mirror cavity.

II. Modal Analysis of Micromirror Electrostatic Actuators

As illustrated in FIGS. 3A-H, the micromirror electrostatic actuators 300*a*, 300*b*, 300*c*, 300*d*, 300*e*, 300*f*, 300*g*, 300*h* in an actuator array (e.g., MEM array 100 as illustrated in FIG. 1A) may receive a simulated frequencies of vibration. To understand ideal device performance, modal analysis was completed for an individual micromirror electrostatic actuator 300*a*, 300*b*, 300*c*, 300*d*, 300*e*, 300*f*, 300*g*, 300*h* to simulate different mechanical movements (e.g., frame rotation, frame translation, mirror rotation, or mirror translation). These simulations were used to compute a modal solution, which provided various results (e.g., frequencies of vibration and relative displacements).

A silicon model for a micromirror electrostatic actuator 300*a*, 300*b*, 300*c*, 300*d*, 300*e*, 300*f*, 300*g*, 300*h* was simulated in ANSYS® in which the micromirror electrostatic actuator 300*a*, 300*b*, 300*c*, 300*d*, 300*e*, 300*f*, 300*g*, 300*h* had a spring height of 7 μm, a structure height of 30 μm, and a total height of 310 μm. The structure beneath the spring height was 23 μm and the blade beneath the structure had a height of 280 μm. Modal analysis was performed and the mode shapes and frequencies are as described in Table I.

TABLE I

| Modal Results | |
|---|---|
| Translation/Rotation | Frequency (Hz) |
| Frame rotation around y-axis | 582.552 |
| Mirror rotation around x-axis | 759.682 |
| Mirror translation in x-direction | 1870.81 |
| Frame rotation around y-axis | |
| Mirror rotation around z axis | 3402.59 |
| Mirror translation in y-direction | 3778.24 |
| Mirror rotation around x-axis | |
| Mirror translation in z-direction | 5906.59 |
| Frame rotation around z-axis | 9383.56 |
| Frame rotation around x-axis | 13500.9 |

III. Structural Changes to Reduce Impact of Force

For a simulation in which an anchor was not present (FIG. 2A) or support anchors 212*b* were not bonded to support webbing 234 in FIG. 2B, 20 μN of total force was applied at a frequency of 400 Hz to the central stage (e.g., central stage 134 in FIG. 1B) in the MEM array (e.g., MEM array 100 in FIG. 1A). The y-direction tilt and/or x-direction tilt in degrees of the mirror receiving the applied force (displayed in bold in row 3, column 2) and the surrounding mirrors are provided as shown in Table II. Cells are grayed out when die are not present in the simulation. Table II corresponds to the case when support anchors 212*b* are not present (FIG. 2A) or are not bonded to support webbing 234 from FIG. 2B (e.g., no anchors bonded).

TABLE II

| MEM Array Configuration - No Anchors Bonded | | | | | |
|---|---|---|---|---|---|
| | Column 1 | Column 2 | Column 3 | Column 4 | Column 5 |
| Row 1 | | | $2.5 \times 10^{-6\circ}$ (x) | | |
| Row 2 | | | | | |
| Row 3 | $9 \times 10^{-6\circ}$ (y) | **36.5°** (y) | $5 \times 10^{-6\circ}$ (y) | | $1 \times 10^{-6\circ}$ (y) |
| Row 4 | | | | | |
| Row 5 | | | $2.5 \times 10^{-6\circ}$ (x) | | |

The tilt of the central stage (e.g., central stage 134 in FIG. 1B) receiving the applied force was computed in the simulation as 36.5°. When a small angle approximation was applied to the MEM array (e.g., MEM array 100 in FIG. 1A), the angle was computed in the simulation as 34°. The deflection of the central stage (e.g., central stage 134 in FIG. 1B) in row 3, column 1 (i.e., having a tilt of $9\times10^{-6\circ}$) may be computed using: deflection (in ppm)=tilt (in degrees)/applied mirror tilt (in degrees), which provides a deflection of 0.26 ppm. Therefore, when an anchor is not bonded, the deflection of the central stage (e.g., central stage 134 in FIG. 1B) in row 3, column 1 provided a baseline from which to compare other results obtained after structural modifications of a micromirror electrostatic actuator 101.

A MEM array (e.g., MEM array 100 in FIG. 1A) may comprise a first stage (e.g., a central stage 134 in FIG. 1B) comprising a first stage reflective surface (e.g., a mirror) and a second stage (e.g., an adjacent central stage) comprising a second stage reflective surface (e.g., a mirror). The MEM array (e.g., MEM array 100 in FIG. 1A) may comprise a base wafer (e.g., silicon wafer 210 in FIG. 2A and FIG. 2B) positioned below the first stage (e.g., a central stage 134 in FIG. 1B) and the second stage (e.g., an adjacent central stage). The base wafer (e.g., silicon wafer 210 in FIG. 2B) may comprise a support anchor (e.g., support anchor 212*b* when bonded to 234 in FIG. 2B) that may be operable to reduce mechanical motion (e.g., harmonic) of the second stage (e.g., an adjacent central stage) when the first stage (e.g., a central stage 134 in FIG. 1B) receives an applied force.

For a simulation in which an anchor was used, i.e. 212*b* is bonded to 234 in FIG. 2B, 20 RN of total force was applied at a frequency of 400 Hz to the central stage (e.g., central stage 134 in FIG. 1B) in the MEM array (e.g., MEM array 100 in FIG. 1A). The cases in which anchors were bonded and were not bonded had the same deflection for the mirror with applied force. The y-direction tilt and/or x-direction tilt in degrees of the central stage (e.g., central stage 134 in FIG. 1B) receiving the applied force (displayed in bold in row 3, column 2) and the surrounding central stages (e.g., surrounding mirrors) are provided as shown in Table III.

TABLE III

| MEM Array Configuration - Anchors Bonded | | | | | |
|---|---|---|---|---|---|
| | Column 1 | Column 2 | Column 3 | Column 4 | Column 5 |
| Row 1 | | | $2 \times 10^{-8\circ}$ (x) | | |
| Row 2 | | | $1.8 \times 10^{-6\circ}$ (x) | | |

TABLE III-continued

| MEM Array Configuration - Anchors Bonded | | | | | |
|---|---|---|---|---|---|
| | Column 1 | Column 2 | Column 3 | Column 4 | Column 5 |
| Row 3 | $5 \times 10^{-7\circ}$ (y) | 36.5° (y) | $3 \times 10^{-7\circ}$ (y) | | $3 \times 10^{-8\circ}$ (y) |
| Row 4 | | | | | |
| Row 5 | | | $2 \times 10^{-8\circ}$ (x) | | |

The tilt of the central stage (e.g., central stage 134 in FIG. 1B) receiving the applied force was computed as 36.5°. When a small angle approximation was applied to the to the MEM array (e.g., MEM array 100 in FIG. 1A), the angle was computed as 34°. The stage (e.g., mirror) in row 3, column 1 of Table III was computed as $5\times10^{-7\circ}$ which is equivalent to a deflection of 0.014 ppm. The crosstalk between the central stage (e.g., mirror) with applied force to the central stage in row 3, column 1 with anchors bonded (i.e., 0.014 ppm) as compared to the crosstalk between the central stage (e.g., mirror) with applied force to the central stage in row 3, column 1 without anchors bonded (i.e., 0.26 ppm) was 5.38%. That is, the percentage of deflection that was transferred from the central stage (e.g., central stage 134 in FIG. 1B) receiving the applied force to the central stage 134 (e.g., mirror) in row 3, column 1 when anchors were bonded was about 5.38% of the amount when anchors were not bonded.

Figure 4A:
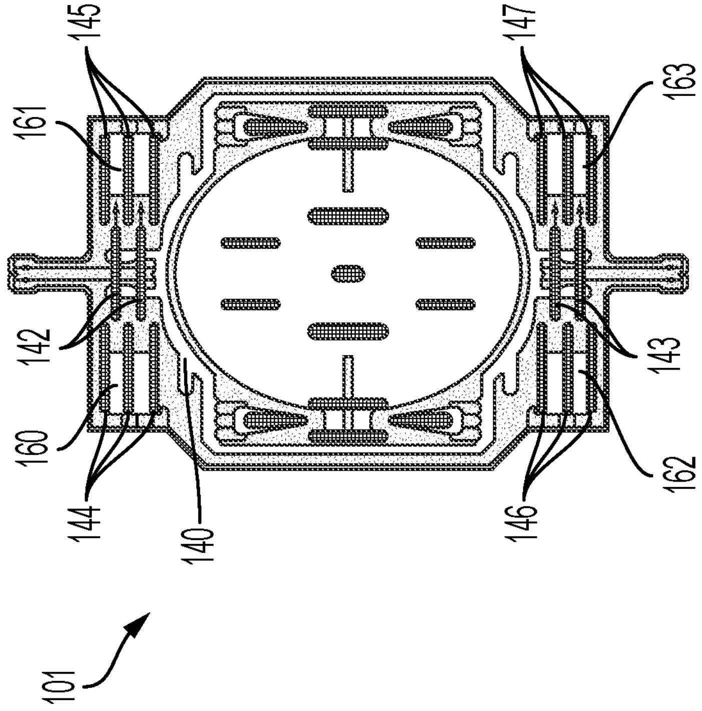
FIGS. 4A-C illustrate the simulated application of force to the micromirror and impact of that force on adjacent micromirrors.
Figure 4B:
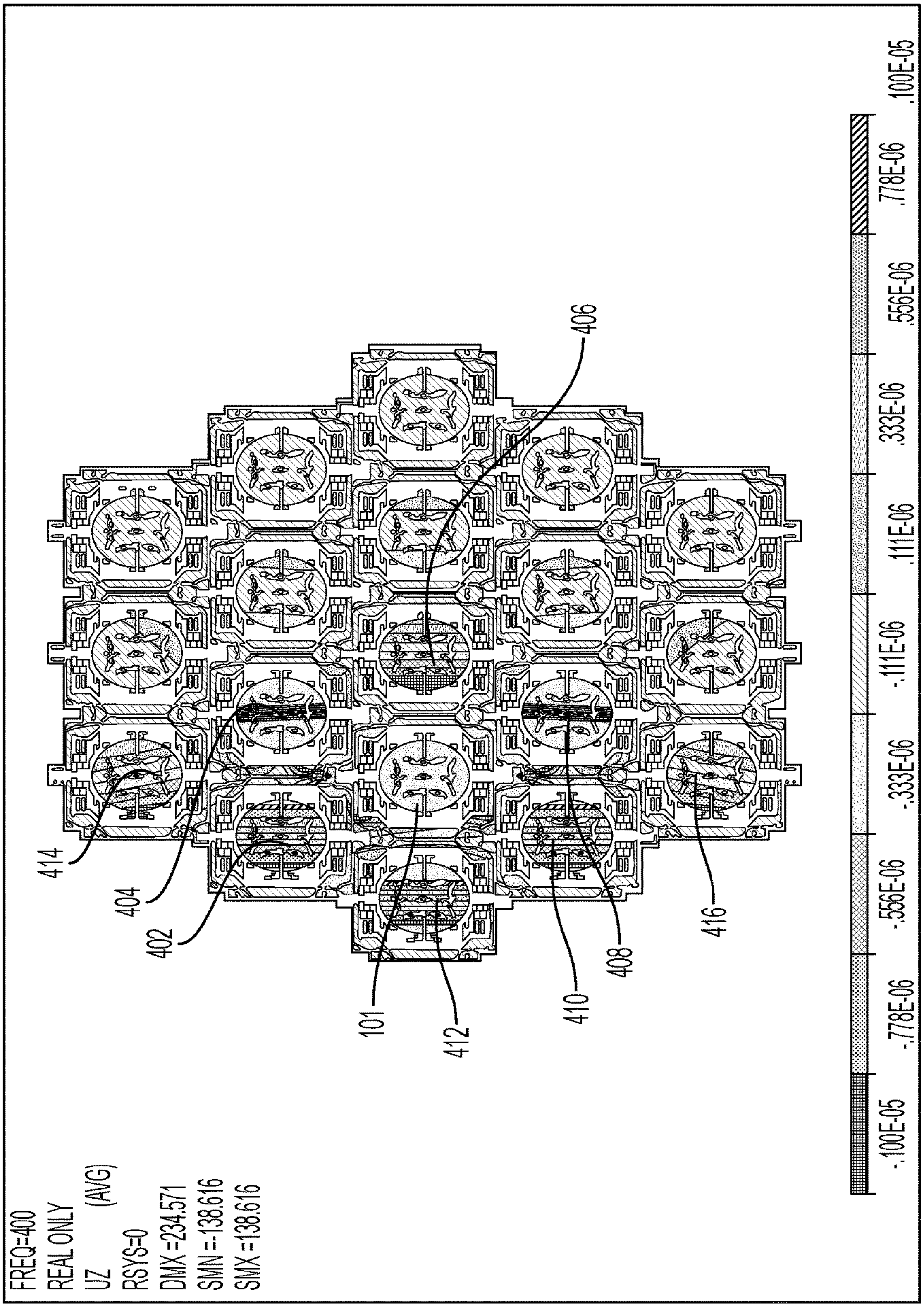
Figure 4C:
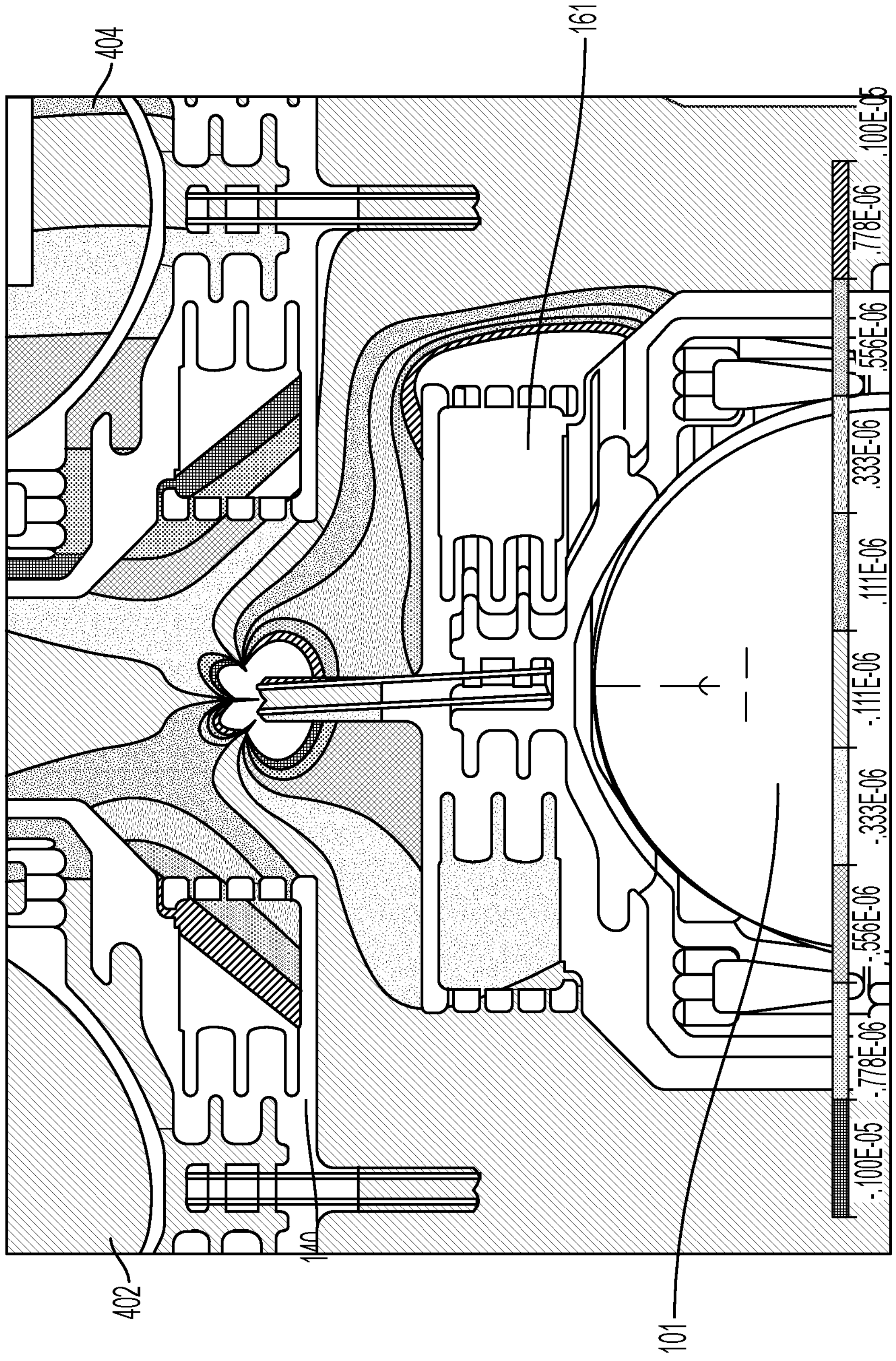

Applying force to one central stage (e.g., central stage 134 in FIG. 1B) in a MEM array (e.g., MEM array 100 in FIG. 1A) may result in unwanted motion in other central stages (e.g., mirror) of surrounding micromirror electrostatic actuators (e.g., micromirror electrostatic actuator 101 in FIG. 1B) even when additional anchors are used. FIGS. 4A-C illustrate the simulated application of force to the mirror cell and the impact of that force on adjacent mirror cells when additional anchors are included.

FIG. 4A shows the undersurface of a micromirror electrostatic actuator 101. For the simulation, a force of 20 μN (total) was applied at 400 Hz to the second pair of high aspect ratio members 142, 143 in the direction of the positive x-axis, and an equal but opposite force was applied, in the positive x-direction as indicated by the arrows, to: (i) the side-flanking members 145 on the stationary frame 161 and (ii) the side-flanking member 147 on the stationary frame 163. This applied force resulted in a vibrational rotation of the moveable frame 140 about the Y axis. The micromirror electrostatic actuator 101 further comprises: a side-flanking members 144 on stationary frame 160, a side-flanking members 146 on stationary frame 162, and a mirror cavity wall (not shown).

FIG. 4B illustrates how this micromirror electrostatic actuator 101 receiving the applied force affected the other mirror cells in the MEM array. The affected mirror cells include the adjoining diagonal mirror cells (402, 404, 406, 408, 410, 412) and the mirror cells that are directly above (414) and directly below (416) the micromirror electrostatic actuator 101 receiving the applied force. The different tilts for some of the other mirrors are recorded in Table III.

For the non-anchored example, the whole mirror array was affected as seen in comparing the results from Table II to table III.

FIG. 4C provides a closer inspection of the case in which anchors are bonded and reveals that applying force to the micromirror electrostatic actuator 101 had the greatest impact on its neighbors diagonally (either up or down) (i.e., 402, 404, 408 (not shown in FIG. 4C), 410 (not shown in FIG. 4C)). The tilt at the diagonal mirror cell 404 was $1.8\times10^{-6}$ degrees. The tilt was transferred from the micromirror electrostatic actuator 101 receiving the applied force to the diagonal mirror cell 404 as a result of the applied torque to the stationary frame (e.g., stationary frame 161).

Figure 5B:
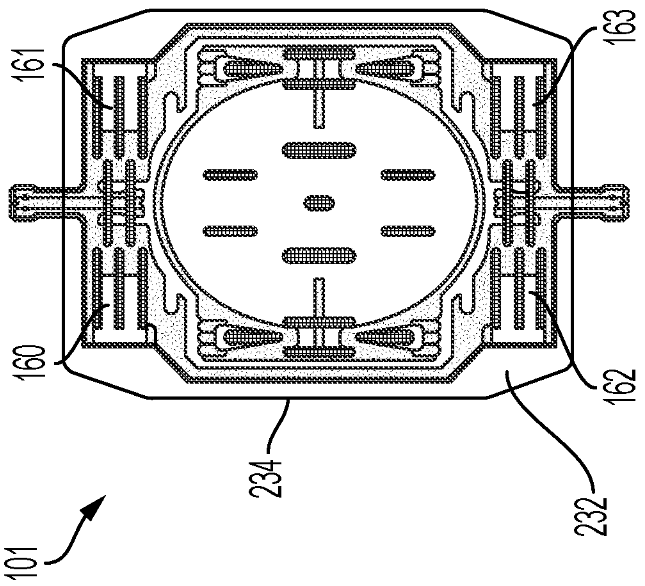
FIGS. 5A-C illustrate a micromirror and surrounding structure and resulting impact of applying force.
Figure 5A:
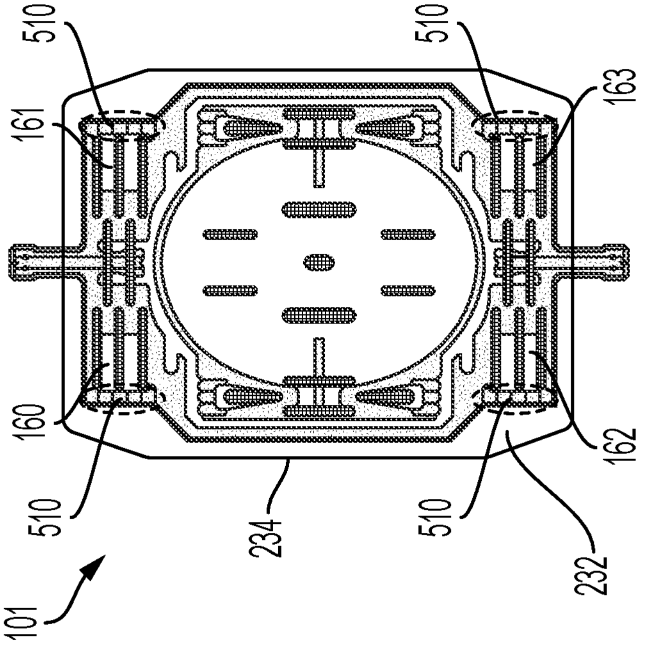

The micromirror electrostatic actuator 101, as illustrated in FIG. 5A may comprise a stationary frame 160, 161, 162, 163 that may be substantially free of holes. For purposes of this disclosure, "substantially" may mean within one or more of 1%, 2%, 3%, 5%, or 10% of a value. A stationary frame 160, 161, 162, 163 may be substantially free of holes when less than one or more of 10%, 5%, 3%, 2%, or 1% of the surface area of the stationary frame comprises holes.

Figure 5C:
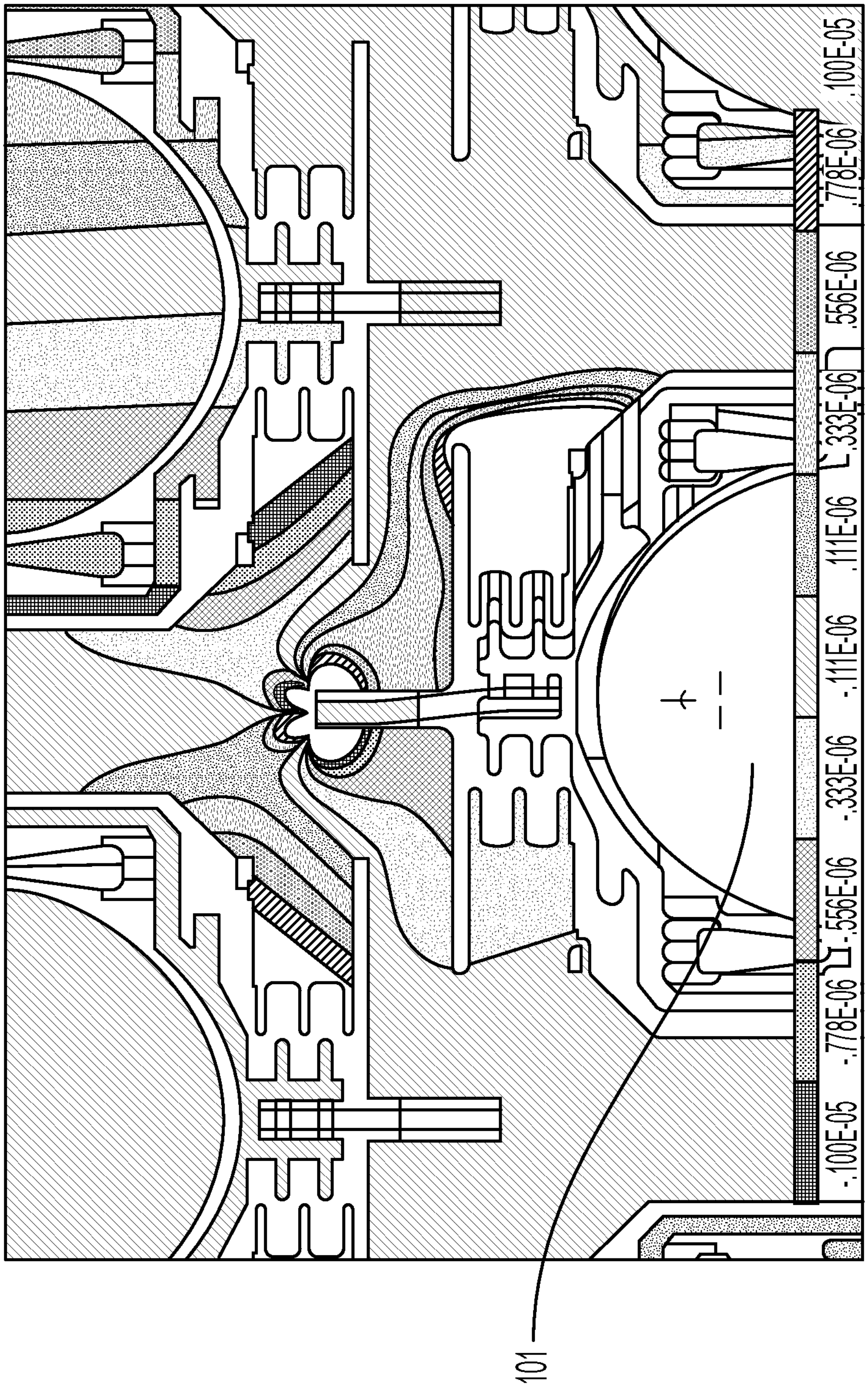

FIGS. 5A-C illustrate a portion of a micromirror electrostatic actuator 101 and surrounding structure (e.g., a mirror cavity wall 234). FIG. 5A illustrates a portion of the mirror with location of apertures 510 or holes in stationary frames 160, 161, 162, and 163. FIG. 5B illustrates the portion of the micromirror electrostatic actuator 101 and surrounding structure (e.g., a mirror cavity wall 234) with the apertures 510 removed from the stationary frames 160, 161, 162, 163.

FIG. 5C illustrates the resulting impact of applying 20 μN of total force at a frequency of 400 Hz to the portion of the micromirror electrostatic actuator 101 when the apertures 510, as shown in FIG. 5A, are removed, as shown in FIG. 5B. The removal of the apertures 510 allowed for the reduction in crosstalk, as illustrated in FIGS. 5D-E, 6A-B, and 7A-B.

Figure 5E:
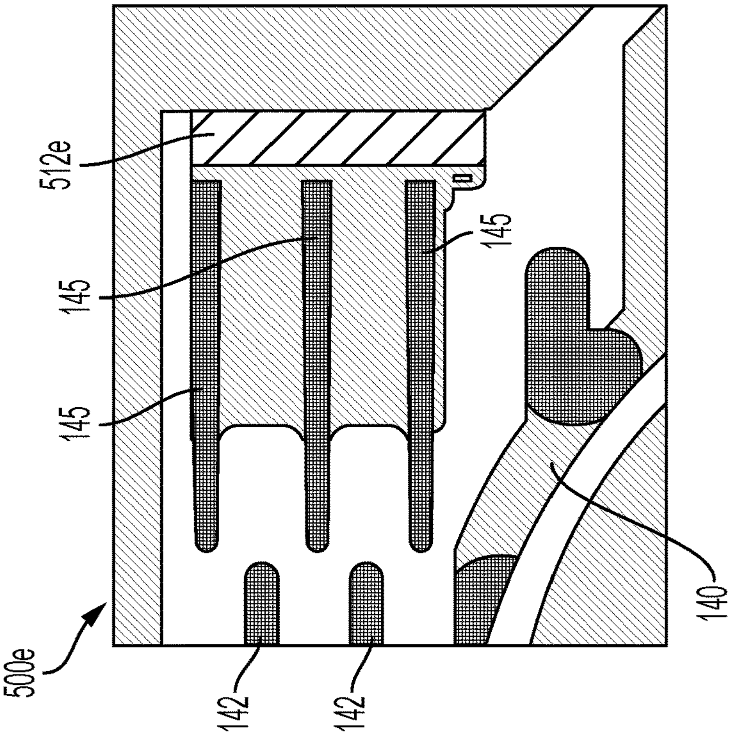
FIGS. 5D-E illustrate a micromirror and surrounding structure.
Figure 5D:
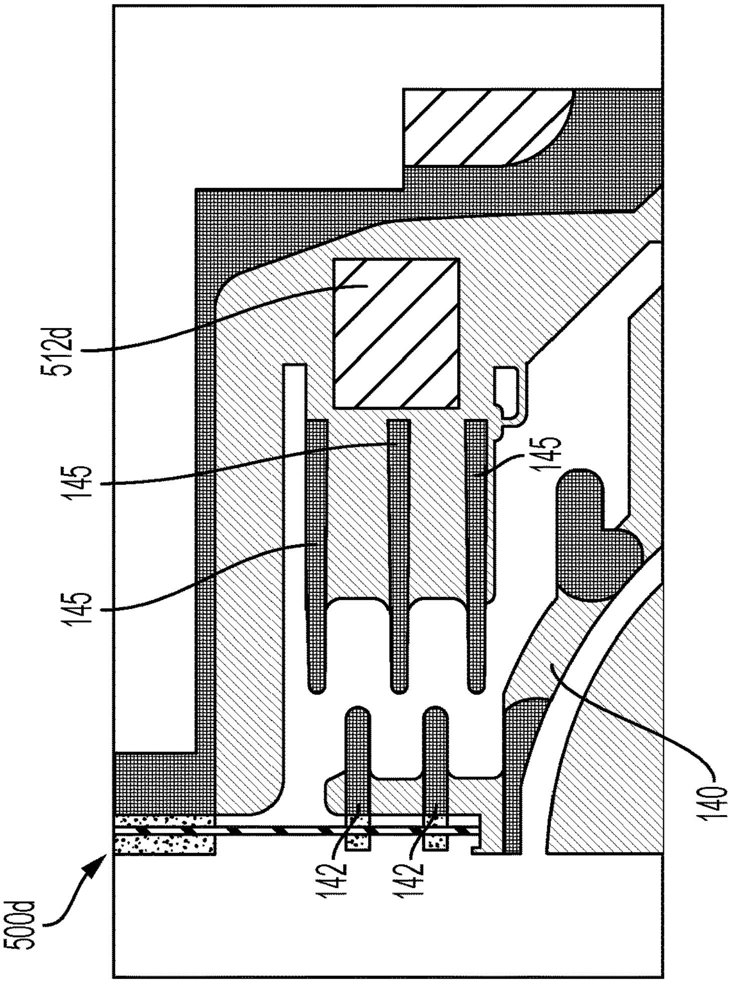

As illustrated in FIG. 5D, a portion of a micromirror electrostatic actuator 500*d* may comprise a moveable frame 140, a stationary frame 161, high aspect ratio members 142, side-flanking members 145, and a stationary frame anchor 512*d*. The stationary frame 161 may be coupled to the stationary frame anchor 512*d*, which may be operable to reduce mechanical motion of a surrounding mirror cell. The stationary frame anchor 512*d* may be positioned near the side-flanking members 145. As illustrated in FIG. 5E, in a portion of a micromirror electrostatic actuator 500*e*, a stationary frame anchor 512*e* having an larger surface area may be positioned closer to the side-flanking members 145 compared to the position of the stationary frame anchor 512*d* in relation to the side-flanking members 145. The stationary frame anchor 512*d* (as illustrated in FIG. may be modified to be the stationary frame anchor 512*e*, which may have a selected surface area that may be oriented towards a surface area of side-flanking members 145. The selected surface area for the stationary frame anchor 512*e* may be an amount that facilitates a reduction in mechanical motion of a surrounding mirror cell. As the selected surface area of the stationary frame anchor 512*e* increases, the mechanical motion of the surrounding mirror cell may decrease.

Figure 6B:
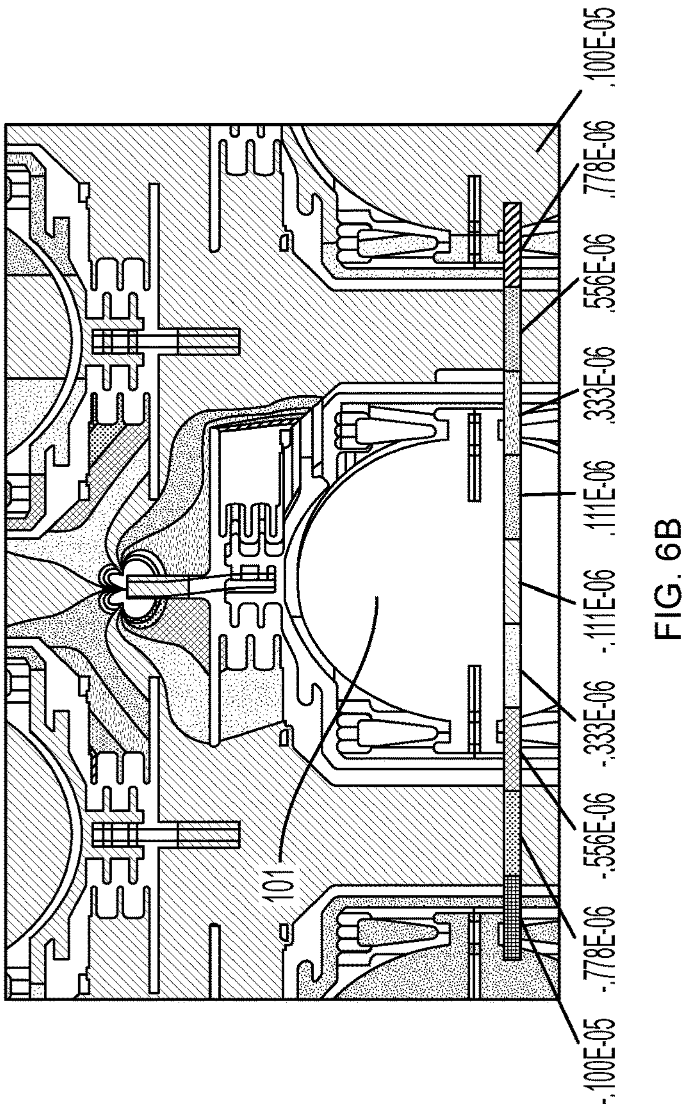
FIGS. 6A-B illustrate a micromirror with holes removed and high aspect ratio members added to support stationary frames along with the resulting impact of applying force.
Figure 6A:
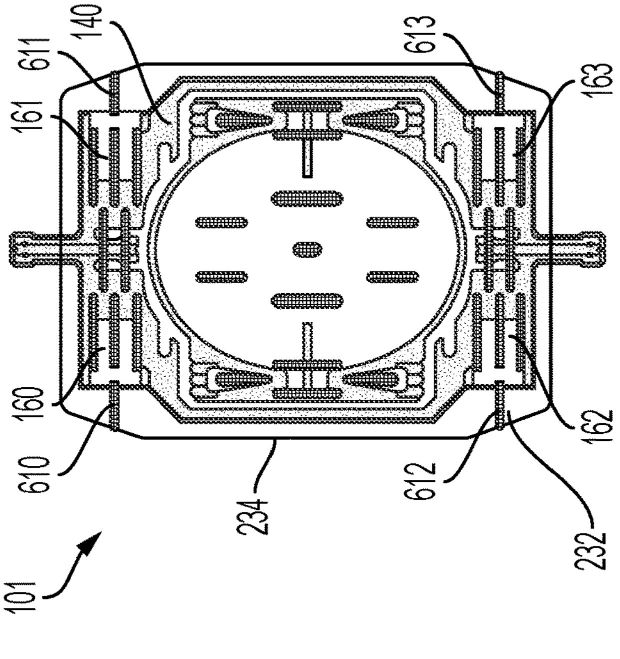

A micromirror electrostatic actuator 101, as illustrated in FIG. 6A, may comprise a first frame (e.g., a moveable frame 140) that may be pivotally coupled to a second frame (e.g., a stationary frame 160, 161, 162, 163). The second frame (e.g., a stationary frame 160, 161, 162, 163) may comprise a second frame high AR member (e.g., high aspect ratio member 610, 611, 612, 613) to facilitate increased stiffness and support to reduce mechanical motion (e.g., harmonic) that may be transferred between a central stage (e.g., central stage 134 as illustrated in FIG. 1B) and a surrounding mirror cell. The second frame high AR member (e.g., high aspect ratio member 610, 611, 612, 613) may be operable to reduce mechanical motion of a surrounding mirror cell. The second frame high AR member (e.g., high aspect ratio member 610, 611, 612, 613) may be configured to contact a mirror cavity wall 234 to facilitate the reduction in transfer of mechanical motion to surrounding mirror cells.

With the additional stiffness and support provided by high aspect ratio member 610, 611, 612, 613, the transfer of motion from the micromirror electrostatic actuator 101 to adjacent mirror cells (e.g., a diagonal mirror) in the MEM array (e.g., MEM array 100 in FIG. 1A) was reduced from a tilt of $1.8\times10^{-6}$ degrees for the anchored scenario to $1.0\times10^{-6}$ degrees for the scenario in which apertures (e.g., apertures 510 as shown in FIG. 5A) were removed and 1 high AR member was added, as shown by the micromirror electrostatic actuator 101 in FIG. 6B. Table IV provides the tilt for different scenarios: (i) anchored without the 1 or 2 higher AR members and without the additional anchors, (ii) 1 high AR member added, (iii) 2 high AR members added, (iv) additional anchor, and (v) larger additional anchor. The cases in Table IV include the support anchors positioned between the stages (e.g., 212*b* bonded to 234 in FIG. 2). The fourth row ("Additional Anchor") further includes the anchor as illustrated in FIG. 5D and the fifth row ("Additional Larger Anchor") further includes the anchor as illustrated in FIG. 5E.

The micromirror electrostatic actuator 101 may comprise one or more of: a third frame (e.g., a second stationary frame of the stationary frames 160, 161, 162, 163) that may comprise a third frame high AR member (e.g., 711, 711') that may be in contact with the mirror cavity wall 234; a fourth frame (e.g., a third stationary frame of the stationary frames 160, 161, 162, 163) that may comprise a third frame high AR member (e.g., 712, 712') that may be in contact with the mirror cavity wall 234; or a fifth frame (e.g., a fourth stationary frame of the stationary frames 160, 161, 162, 163) that may comprise a fourth frame high AR member (e.g., 713, 713') that may be in contact with the mirror cavity wall 234.

Figure 7B:
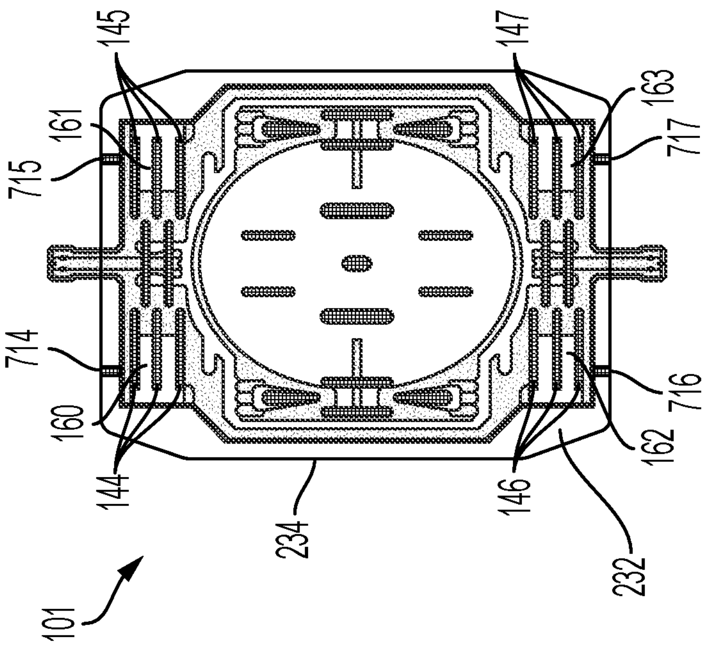
FIGS. 7A-B illustrate additional configurations of a micromirror with high aspect ratio members added to support stationary frames.
Figure 7A:
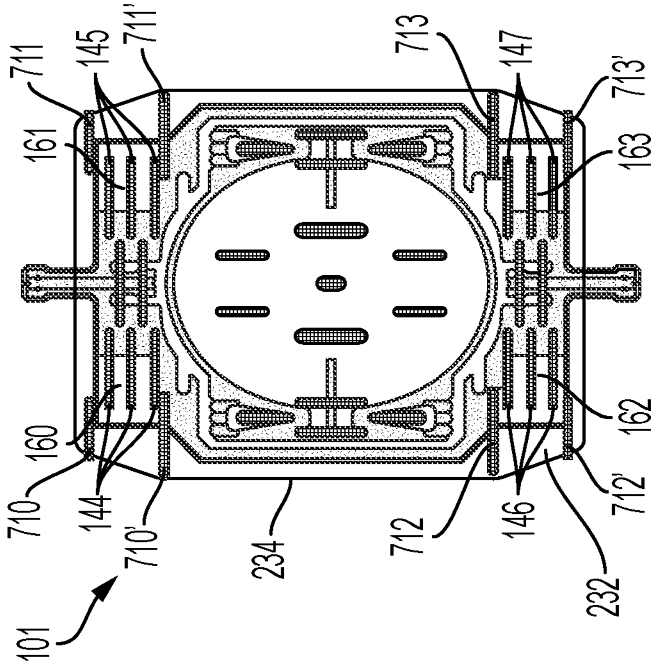

In FIG. 7A the micromirror electrostatic actuator 101 is shown with the holes (e.g., apertures 510 as shown in FIG. 5A) removed and a plurality of high aspect ratio members 710, 710', 711, 711', 712, 712', 713, 713' added to support the stationary frames 160, 161, 162, and 163. The first pair of high aspect ratio members 710, 710' overlap with the side-flanking member 144 on stationary frame 160. That is, the x-axis coordinates for high aspect ratio member 710 overlap with the x-axis coordinates for high aspect ratio member 710', and the x-axis coordinates for high aspect ratio member 710 and high aspect ratio member 710' overlap with the x-axis coordinates for one or more of the first pair of side-flanking members 144. A second pair of high aspect ratio members 711, 711' overlap with side-flanking members 145 on stationary frame 161. That is, the x-axis coordinates for high aspect ratio member 711 overlap with the x-axis coordinates for high aspect ratio member 711', and the x-axis coordinates for the second pair of high aspect ratio member 711, 711' overlap with the x-axis coordinates for one or more side-flanking members (e.g., side flanking member 145). A third pair of high aspect ratio members 712, 712' overlap with side-flanking member 146 on stationary frame 162. That is, the x-axis coordinates for 712 overlap with the x-axis coordinates for 712', and the x-axis coordinates for high aspect ratio member 712 and high aspect ratio member 712' overlap with the x-axis coordinates for one or more side-flanking members (such as side-flanking member 146). A third pair of high aspect ratio members 713, 713' overlap with side-flanking member 147 on stationary frame 163. That is, the x-axis coordinates for high aspect ratio member 713 overlap with the x-axis coordinates for high aspect ratio member 713', and the x-axis coordinates for high aspect ratio member 713, 713' overlap with the x-axis coordinates for one or more side-flanking members such as side-flanking member 147. One or more of the high aspect ratio members 710, 710', 711, 711', 712, 712', 713, 713' may contact a mirror cavity wall 234.

TABLE IV

Tilt for different scenarios

| Scenario | Mirror Location Relative to Harmonically-Driven mirror | Tilt (degrees) |
|---|---|---|
| Anchored | Up and right | $1.8 \times 10^{-6}$ |
| 1 high aspect ratio member added | Up and right | $1.0 \times 10^{-6}$ |
| 2 high aspect ratio member added | Up and right | $5.7 \times 10^{-7}$ |
| Additional Anchor | Up and right | $1.1 \times 10^{-6}$ |
| Additional Larger Anchor | Up and right | $1.2 \times 10^{-6}$ |

A micromirror electrostatic actuator 101, as illustrated in FIG. 7A, may comprise a first frame (e.g., a moveable frame 140 in FIG. 1B) that may be pivotally coupled to a second frame (e.g., a stationary frame from the stationary frames 160, 161, 162, 163). The second frame may comprise at least two second high aspect ratio members 710, 710' (e.g., frame high AR members) operable to facilitate increased stiffness and support to reduce mechanical motion (e.g., harmonic) that may be transferred between a central stage (e.g., central stage 134 as illustrated in FIG. 1B) and a surrounding mirror cell. The two second high aspect ratio members 710, 710' may be configured to contact a mirror cavity wall 234 to facilitate the reduction in transfer of mechanical motion to surrounding mirror cells. The gap between the two second high aspect ratio members 710, 710' may be configured to avoid one or more of: (i) contact with other members, or (ii) impacting an etch.

The two second high aspect ratio members 710, 710' may be substantially parallel to each other. The two second high aspect ratio members 710, 710' may be substantially parallel to each other. Two members may be substantially parallel to each other when the angle between the two members differs by less than one or more of 10 degrees, 5 degrees, 3 degrees, 2 degrees, or 1 degree from an angle of 0 degrees between the two members.

With the additional stiffness and support provided by the plurality of high aspect ratio member 710, 710', 711, 711', 712, 712', 713, 713', the transfer of motion from the micromirror electrostatic actuator 101 to adjacent mirror cells (e.g., a diagonal mirror) in the array was reduced from a tilt of $1.0\times10^{-6}$ degrees for the 1 additional high AR member to $5.7\times10^{-7}$ degrees for the scenario in which 2 high AR members were added to support the stationary frames 160, 161, 162, 163, as shown by the micromirror electrostatic actuator 101 in FIG. 7A.

A micromirror electrostatic actuator 101, as illustrated in FIG. 7B, may comprise a first frame (e.g., a moveable frame 140 in FIG. 1B) that may be pivotally coupled to a second frame (e.g., a stationary frame 160, 161, 162, 163). The second frame (e.g., a stationary frame 160, 161, 162, 163) may comprise one or more side-flanking members (e.g., 144). The second high aspect ratio member of the high aspect ratios members 714, 715, 716, 717 may be positioned with respect to one or more of the first pair of side-flanking members 144, 145, or the second pair of the side-flanking members 146, 147 on the same stationary frame (e.g., stationary frame 160, 161, 162, 163) to avoid one or more of: (i) contact with other members, or (ii) impacting an etch.

A second high aspect ratio member of the high aspect ratio members 714, 715, 716, 717 may be substantially perpendicular to the one or more of the first pair of side-flanking members 144, 145, or the second pair of the side-flanking members 146, 147 on the same stationary frame (e.g., stationary frame 160, 161, 162, 163). Two members may be substantially perpendicular to each other when the angle between the two members differs by less than one or more of 10 degrees, 5 degrees, 3 degrees, 2 degrees, or 1 degree from perpendicular (i.e., 90 degrees).

FIG. 7B illustrates another configuration of a micromirror electrostatic actuator 101 with holes (e.g., apertures 510 as shown in FIG. 5A) removed and high aspect ratio members 714, 715, 716, and 717 added to support the stationary frames 160, 161, 162, and 163, respectively. The high aspect ratio member 714 may be aligned perpendicular to one or more of the side-flanking members 144 on stationary frame 160. The high aspect ratio member 715 may be aligned perpendicular to one or more side-flanking member 145 on stationary frame 161. The high aspect ratio member 716 may be aligned perpendicular to one or more side-flanking members such as side-flanking member 146 on stationary frame 162. The high aspect ratio member 717 may be aligned perpendicular to one or more second frame side-flanking members such as side-flanking member 147 on stationary frame 163. One or more of the high aspect ratio members 714, 715, 716, 717 may contact a mirror cavity wall 234.

Thus, placement of anchors and/or high aspect ratio members in a mirror cell may be operable to reduce harmonic amplitude of vibration of adjacent mirror cells to facilitate increased performance of the MEM array compared to a baseline scenario in which placement of anchors and/or high aspect ratio members is not used.

Figure 8:
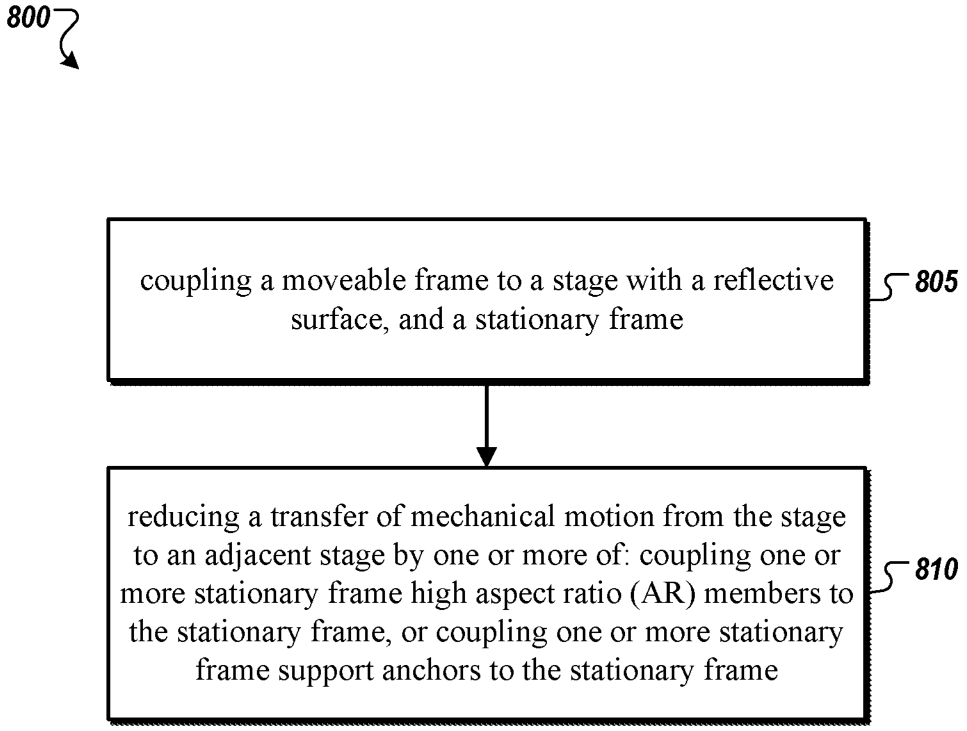
FIG. 8 illustrates a process flow for reducing coupling between adjacent stages in a microelectromechanical (MEM) array.

FIG. 8 illustrates a process flow of an example method 800 that may be used for reduced coupling between adjacent stages in a MEM array, in accordance with at least one example described in the present disclosure. The method 800 may be arranged in accordance with at least one example described in the present disclosure.

The method 800 may begin at block 805 where the method may comprise coupling a moveable frame to: a stage including a reflective surface, and a stationary frame.

At block 810, the method may comprise reducing a transfer of mechanical motion from the stage to an adjacent stage by one or more of: coupling one or more stationary frame high aspect ratio (AR) members to the stationary frame, or coupling one or more stationary frame support anchors to the stationary frame. The one or more stationary frame high aspect ratio members may be positioned to contact a mirror cavity wall. The one or more stationary frame support anchors have a selected surface area that may be oriented towards a selected surface area of one or more side flanking members of the stationary frame. The stationary frame may comprise one or more side-flanking members that may be substantially perpendicular to the one or more stationary frame high AR members. The stationary frame may be substantially free of apertures.

Modifications, additions, or omissions may be made to the method 800 without departing from the scope of the present disclosure. For example, in some examples, the method 800 may include any number of other components that may not be explicitly illustrated or described.

IV. Methods of Manufacture

The methods for fabricating a MEM array (e.g., MEM array 100 in FIG. 1A) may comprise forming a layer of dielectric material on a first side of a substrate; forming on the first side of the substrate vertical isolation trenches containing dielectric material; patterning a masking layer on a second side of the substrate that is opposite to the first side of the substrate; forming vias on the first side of the substrate; metallizing the first side of the substrate; depositing a second metal layer on the first side of the substrate to form a reflective surface; forming second trenches on the first side of the substrate to define structures; deeply etching the second side of the substrate to form narrow blades; bonding a base wafer (e.g., silicon wafer 210 in FIG. 2A-B) to the second side of the substrate after forming the narrow blades; and etching through the second trenches on the first side of the substrate to release the structures and to provide electrical isolation.

The MEM array 100 may comprise a first stage 112*a* (e.g., a central stage), which may comprise a first stage reflective surface (e.g., a metal layer which may be operable as a mirror and which may have a first resonant frequency). The MEM array 100 may comprise a second stage 112*b* (e.g., a central stage of a different mirror cell), which may comprise a second stage reflective surface (e.g., a metal layer which may be operable as a mirror and which may have a second resonant frequency). The MEM array 100 may comprise a base wafer (e.g., a silicon wafer) positioned below the first stage 112*a* and the second stage 112*b*. The first stage 112*a* may be pivotally coupled to a first frame (e.g., a moveable frame 140). The first frame (e.g., a moveable frame 140) may be pivotally coupled to a second frame (e.g., stationary frame 160). The second frame (e.g., stationary frame 160) may comprise one or more of: a second frame high aspect ratio (AR) member (e.g., high aspect ratio member 610, 611, 612, 613 as illustrated in FIG. 6A) or a second frame support anchor (e.g., a stationary frame anchor 512*d* as illustrated in FIG. 5D or a stationary frame anchor 512*e* as illustrated in FIG. 5E).

The substrate may comprise a silicon wafer. Alternatively or in addition, the dielectric material may be silicon dioxide. Alternatively or in addition, the method may include one or more of forming a passivation dielectric layer on the first side of the substrate after metallizing the first side of the substrate and attaching a lid wafer to the first side of the substrate. The lid wafer may be comprised of glass.

Process flow for a method of manufacture is set forth with reference to FIGS. 9A-9K.

Figure 9B:
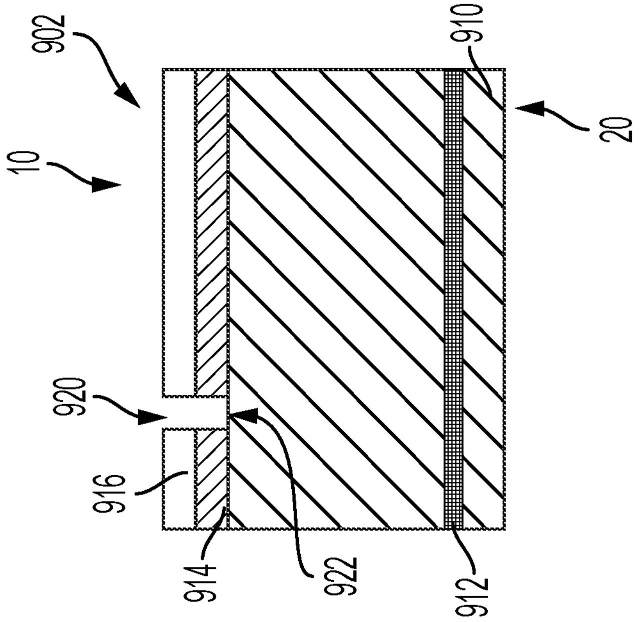
FIGS. 9A-K illustrate a method of manufacturing a MEM array.
Figure 9A:
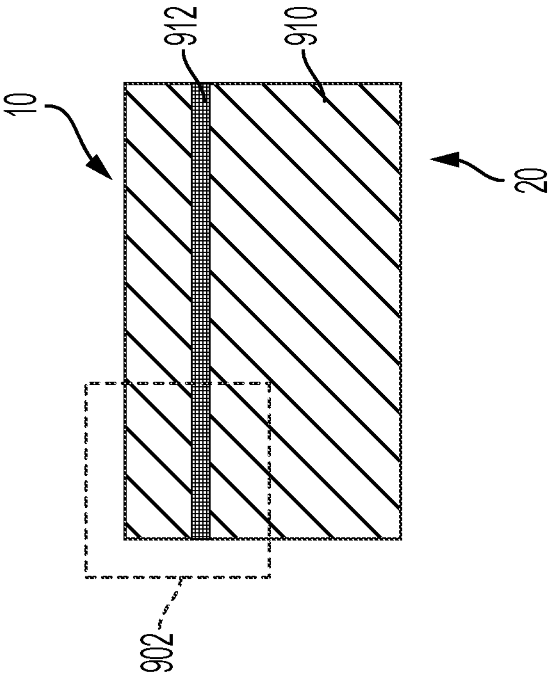

FIG. 9A illustrates a cross-section of a silicon wafer 910 (e.g., silicon on interface wafer) that may be chosen to be in the thickness range of 300-600 micrometers (urn). The silicon wafer 910 may have a top side 10 (or device side or simply a top) and a backside or bottom side 20. Layers within the MEM array 100 formed from the silicon wafer 910 may have a layer top surface oriented towards top side 10 and a bottom surface oriented towards bottom side 20. The upper left hand portion 902 is marked. The buried oxide layer 912 may be 0.5-1 um thick and located 10-50 um beneath the top side 10.

FIGS. 9B-9E illustrate the upper left hand portion 902 of the silicon wafer 910 in a MEM array (e.g., MEM array 100, as illustrated in FIG. 1A) which illustrates fabrication techniques for of isolation trenches 920 on the top side 10 of silicon wafer 910. The isolation trenches 920 may be vertically positioned on the silicon wafer substrate and filled with a dielectric material (e.g., silicon dioxide). Once filled, the isolation trenches 920 may provide electrical isolation between blades after the mirror is released. A masking layer 914 may remain on the surface of the silicon wafer 910 and may be planarized after the isolation trench fill process to ease subsequent lithographic patterning and eliminate surface discontinuities.

Referring to FIG. 9B, a silicon wafer 910 may be provided with a masking layer 914. The masking layer 914 may be silicon dioxide (e.g., an oxide layer). The silicon wafer 910 may be of arbitrary doping, resistivity, and crystal orientation, because the process depends on reactive ion etching to carve and form the structures. The masking layer 914 may protect the upper surface of the silicon wafer 910 during the isolation trench etching process, and thus represents a masking layer. This masking layer may be formed from any number of techniques, including thermal oxidation of silicon or chemical vapor deposition (CVD). The thickness of the masking layer 914 may be 0.5-1.0 um. A photoresist layer 916 may be spun onto the silicon wafer 910 and exposed and developed using photolithography techniques to define the isolation trench pattern for the isolation trench 920. Reactive ion etching may be used to transfer the photoresist pattern to the masking layer 914, exposing the top surface of the silicon wafer 910 (i.e., the bottom 922 of the isolation trench 920). The silicon dioxide mask may be etched in Freon gas mixture, for example $CHF_3$ or $CF_4$. High etch rates for silicon dioxide etching may be achieved using a high density plasma reactor, such as an inductively coupled plasma ("ICP") chamber. These ICP chambers may use a high power radiofrequency (RF) source to sustain the high density plasma and a lower power RF bias on the wafer to achieve high etch rates at low ion energies. Oxide etch rates of 200 nm/min and selectivities to photoresist greater than 1:1 may occur for this hardware configuration.

Figure 9D:
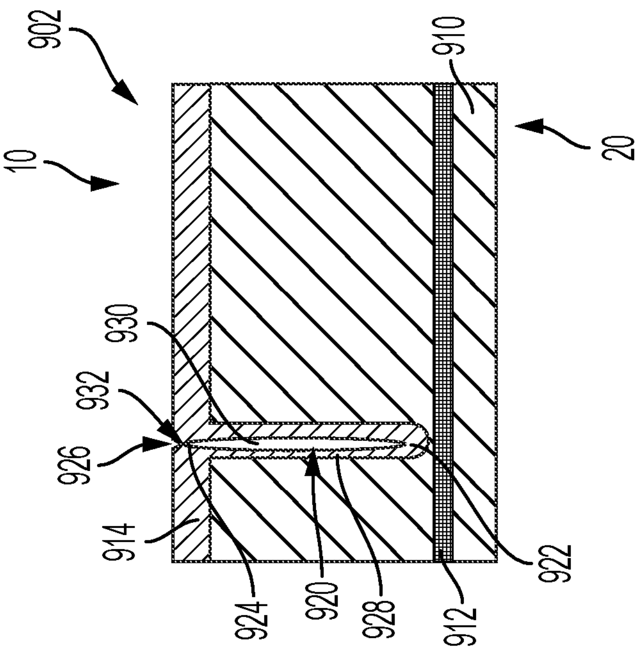
Figure 9C:
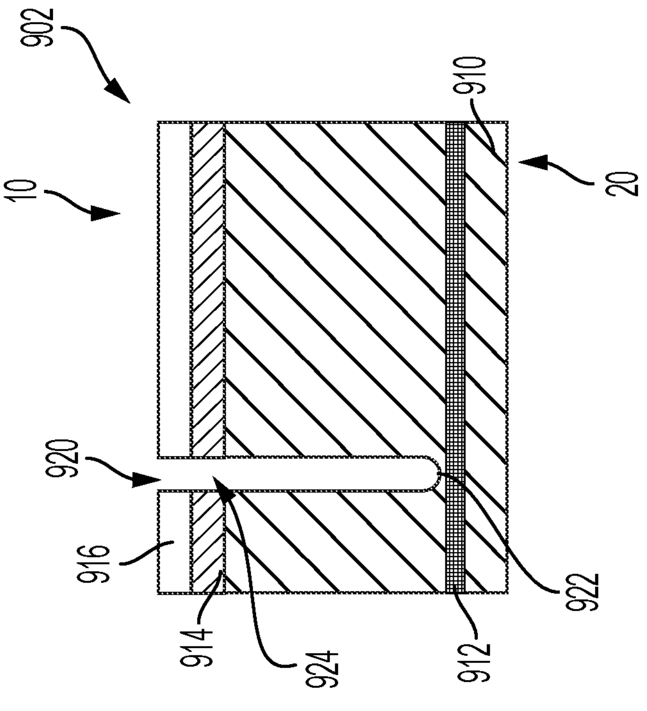

As illustrated in FIG. 9C, an isolation trench 920 may be formed in the silicon wafer 910 by deep reactive ion etching of silicon using high etch rate, high selectivity etching. The trench may be commonly etched in a high-density plasma using a sulfur hexafluoride ($SF_6$) gas mixture as described in U.S. Pat. No. 5,501,893. Etching may be controlled so that the isolation trench 920 profile is reentrant, or tapered, with the top 924 of the isolation trench 920 being narrower than the bottom 922 of the isolation trench 920. Tapering of the isolation trench 920 may allow for electrical isolation in subsequent processing. Profile tapering may be achieved in reactive ion etching by tuning the degree of passivation, or by varying the parameters (power, gas flows, pressure) of the discharge during the etching process. Because the isolation trench 920 may be filled with dielectric material, the opening at the top 924 of the isolation trench 920 may be typically less than 2 um in width. The isolation trench 920 depth may be in the range 10-50 um. The isolation trench 920 may etch stops at the buried oxide layer 912. A procedure for etching the isolation trench 920 may be to alternate etch steps ($SF_6$ and argon mixture) with passivation steps (Freon with argon) in an ICP plasma to achieve etch rates in excess of 2 um/min at high selectively to photoresist (>50:1) and oxide (>100:1). The power and time of the etch cycles may be increased as the trench deepens to achieve the tapered profile. Although the trench geometry may be reentrant, arbitrary trench profiles may be accommodated with adjustments in microstructure processing. Good isolation results may be achieved with any of a number of known trench etch chemistries. After the silicon trench is etched, the photoresist layer 916 may be removed with wet chemistry or dry ashing techniques, and the masking layer 914 may be removed with a reactive ion etch ("RIE") or buffered hydrofluoric acid.

Referring to FIG. 9D, the isolation trench 920 may be filled with an insulating dielectric material (e.g., silicon dioxide). The filling procedure may result in the mostly solid isolation segment in the isolation trench 920, and may deposit a layer of dielectric material on the top side 10 (top surface) of the silicon wafer 910 and dielectric layers on the sidewall 928 and bottom 922 of the isolation trench 920. The thickness of the deposited layer may be in excess of 1 um. This fill may be accomplished with chemical vapor deposition ("CVD") techniques or with oxidation of silicon at high temperatures. In thermal oxidation, the wafer may be exposed to an oxygen rich environment at temperatures from 900-1150° C. This oxidation process may consume silicon surfaces to form silicon dioxide. The resulting volumetric expansion from this process may cause the sidewalls of the trenches to encroach upon each other, eventually closing the trench opening. In a CVD fill, some dielectric may be deposited on the walls but filling may occur from deposition on the bottom of the trench. CVD dielectric fill of trenches may be demonstrated with tetraethyl orthosilicate (TEOS) or silane mixtures in plasma enhanced CVD chambers and low pressure CVD furnace tubes.

During the isolation trench 920 filling process, isolation trench profiles may be incompletely filled, causing an interface 932 and a void 930 to be formed in the isolation trench 920. A local concentration of stress in the void 930 may cause electrical and mechanical malfunction for some devices, but may not interfere with micromechanical devices due to the enclosed geometry of the isolation trench 920. The interface 932 and void 930 may be eliminated by shaping the isolation trench 920 to be wider at the isolation trench opening located at the top 924 of the isolation trench 920 than the bottom 922 of the isolation trench 920. However, good electrical isolation may use additional tapering of the microstructure trench etch in the later operations. Another artifact of the isolation trench filling process may be an indentation 926 that may be formed in the surface of the masking layer 914 centered over the isolation trench 920. This indentation may be as deep as 0.5 um, depending on the thickness of the deposition. To remove the indentation 926, the surface may be planarized to form a flat, or substantially flat, surface, as illustrated in FIG. 9E, for subsequent lithographic and deposition steps. Planarization is performed either by chemical-mechanical polishing (CMP) or by depositing a viscous material, which may be photoresist, spin-on glass, or polymide, and flowing the material to fill the indentation 926 to a smooth finish. During etchback of the viscous material, which may be the second step of planarization, the surface may be etched uniformly, including the filled indentation. Therefore, by removing part of the surface oxide layer, the indentation 926 may be removed to create a uniform thickness layer. For example, if the masking layer 914 is originally 2 um in thickness, then planarization to remove the indentation 926 may leave a masking layer 914 having a final thickness of less than 1 um. The top side 10 (upper surface) of silicon wafer 910 may be free from imperfection and may be ready for further lithography and deposition.

Figure 9F:
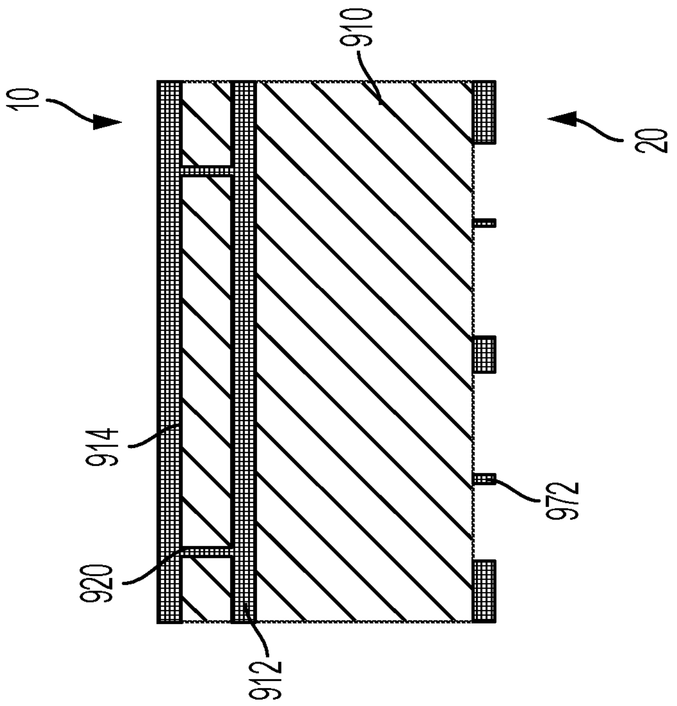
Figure 9E:
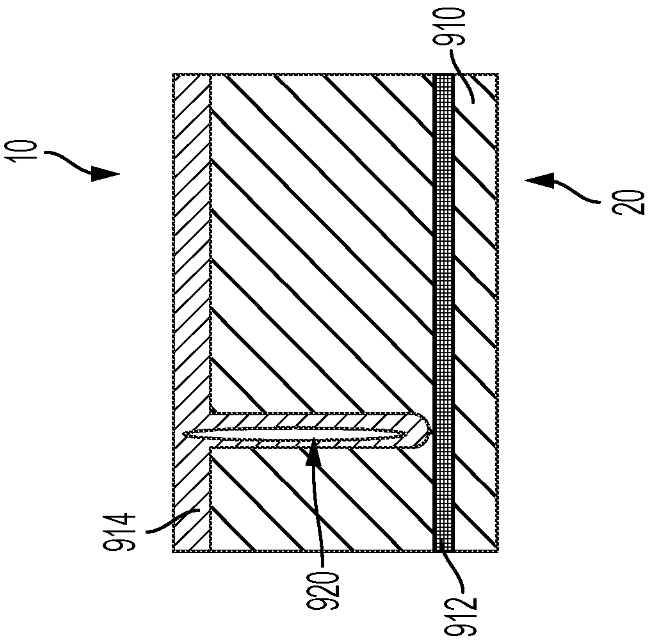

FIG. 9F shows silicon wafer 910 with masking layer 914 and isolation trenches 920. After the isolation trenches 920 are fabricated, front-to-back alignment may be used to lithographically pattern the masking layer for the blades on the bottom side 20 (backside) of the silicon wafer 910. The blade pattern 972 may be exposed and etched into a masking layer 914. The masking layer 914 may be a layer comprised of a combination of thermally grown silicon oxide and oxide deposited by chemical vapor deposition. It may also be comprised of a metal layer such as aluminum. The lithography pattern may be transferred in the masking layer by reactive ion etching, yet the silicon blade etching may not be completed until later in the process. Without the blades etched, the wafer may be easily processed through the remaining device layers. The backside of the blade pattern 972 may be typically aligned topside to the isolation trenches 920 to within several microns.

Figure 9H:
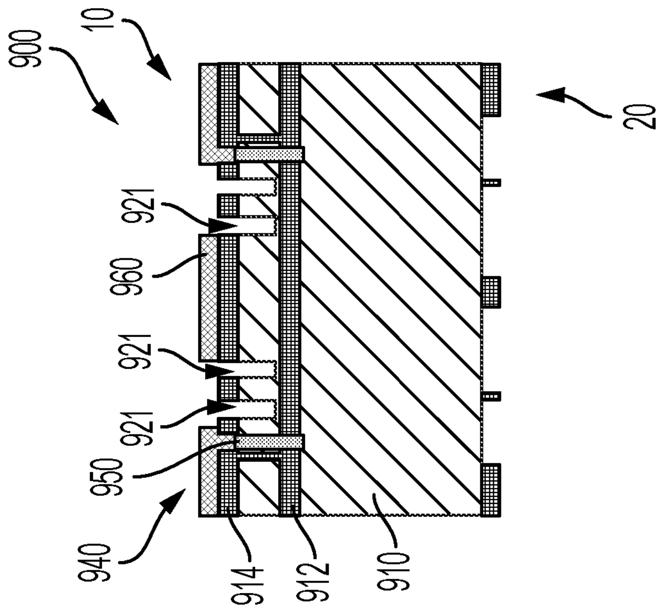
Figure 9G:
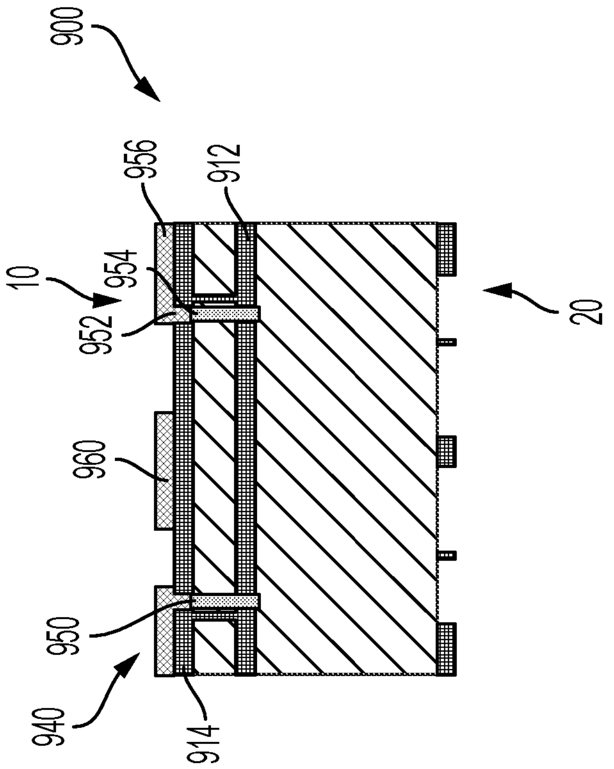

Metallization on the top side 10 of the silicon wafer 910 may proceed as illustrated in FIG. 9G. In order to make contact to the underlying silicon wafer 910 vias 952 may be patterned and etched into the masking layer 914 using lithography and reactive ion etching. In some areas, the vias may be etched through the buried oxide layer 912 and filled with polysilicon to produce polysilicon vias 950. After the vias 952 are etched, metallization may be deposited to form a metal layer 940 and patterned to form a metal interconnect 956 and a contact 954 to the silicon wafer 910 through the via 952. For one example, the metal may be aluminum and may be patterned using wet etching techniques. In mirror arrays with high interconnect densities, patterning the metal using dry etching or evaporated metal lift-off techniques may achieve finer linewidths. The metal layer 940 may be used to provide bond pads and interconnects, which may connect electrical signals from control circuitry to a mirror to control mirror actuation.

Deposition of a second metal layer 960 may provide a reflective mirror surface. This metal may be tuned to provide high mirror reflectivities at the optical wavelengths of interest, and may be evaporated and patterned using lift-off techniques to allow a broader choice of metallization techniques. The metallization may be comprised of 500 nm of aluminum. However, additional metal stacks such as Cr/Pt/Au may be used to increase reflectivities in the wavelength bands common to fiber optics. Because the metals may be deposited under stress and may affect the eventual mirror flatness, reducing the thickness of the masking layer 914 in the region of the mirror may be accomplished through the use of dry etching of the underlying dielectric prior to evaporation.

In FIG. 9H, the topside processing may be completed. First, a passivation dielectric layer (not shown) may be applied to protect the metallization during subsequent processing. The passivation dielectric layer may be removed in the region of the bonding pads. Second, the mirror structure including frame, mirror, and supports may be defined using multiple etches that define trenches 921 separating the structural elements. The etches may be self-aligned and proceed through the various metal, dielectric, and silicon wafers 910. A further blanket deposition may be applied to the topside which passivates the sidewalls of the trenches 921 and prepares the topside for mechanical release.

Figure 9J:
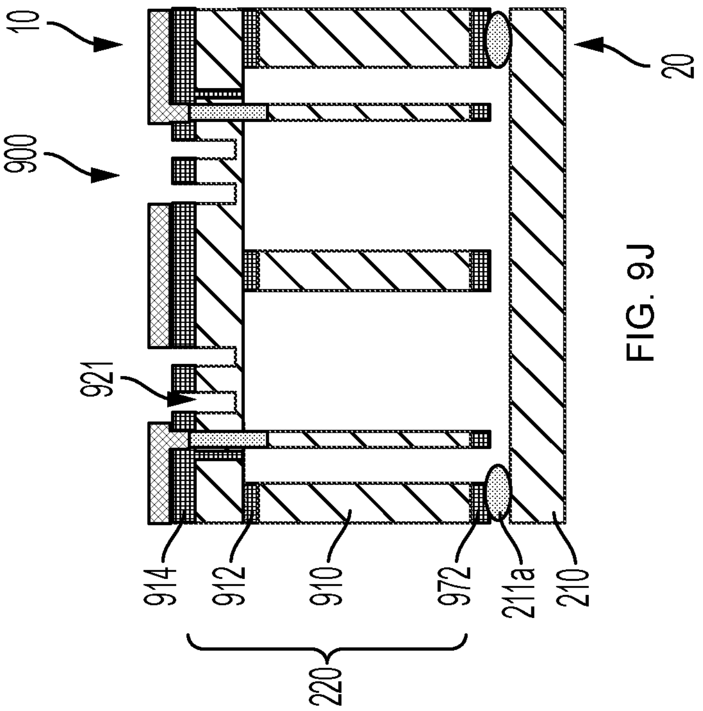
Figure 9I:
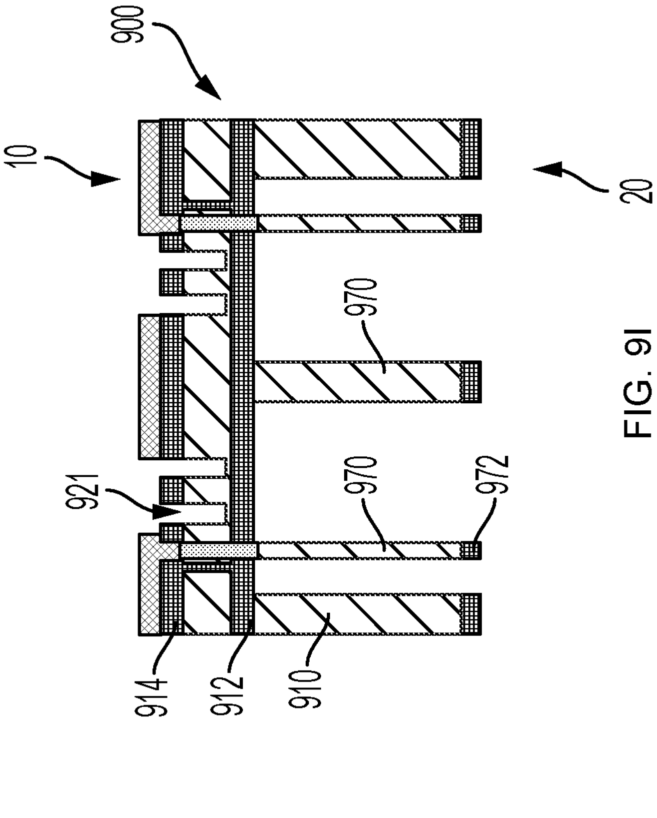

As shown in FIG. 9I, backside silicon etching may transfer the blade pattern 972 into the silicon wafer 910 substrate to obtain the blades 970. The etching may be performed using deep silicon etching at high selectivity to oxide using the techniques disclosed in U.S. Pat. No. 5,501,893. The deep silicon etching achieves near vertical profiles in the blades 970, which may be nominally 5-20 um wide and in excess of 300 um deep. The etch stops on the buried oxide layer 912 to provide a uniform depth across the wafer while not punching through the top side 10 surface of the silicon wafer 910. Since the etch stops on the buried oxide layer 912, elongated members 148 may not be used to remove etch depth variations across the device. Therefore, different patterns may be possible. Blades 970 may be etched simultaneously across the mirror element and across the mirror array. Buried oxide layer 912 may be etched at this time.

Referring to FIG. 9J, because the device wafer is now prepared for microstructure release, the device wafer 220 may become more susceptible to yield loss due to handling shock or air currents. In order facilitate handling and aid in hermetically sealing the mirror array, a silicon wafer 210 (or base wafer) may be bonded to the device wafer 220 to protect the blades after release. For one example, the bonding may be accomplished through the use of a bonding element 211*a* such as a frit glass material bonding element that may be heated to its flow temperature and then cooled. In this manner, a 400° C. temperature bonding elements 211*a* produces a hermetic seal to surround the mirror array. The separation between the device wafer 220 and the silicon wafer 210 using the bonding elements 211*a* such as a frit glass material bonding element, may allow the blades to swing through high rotation angles without impedance. Typically, the standoff may be greater than 25 um.

Figure 9K:
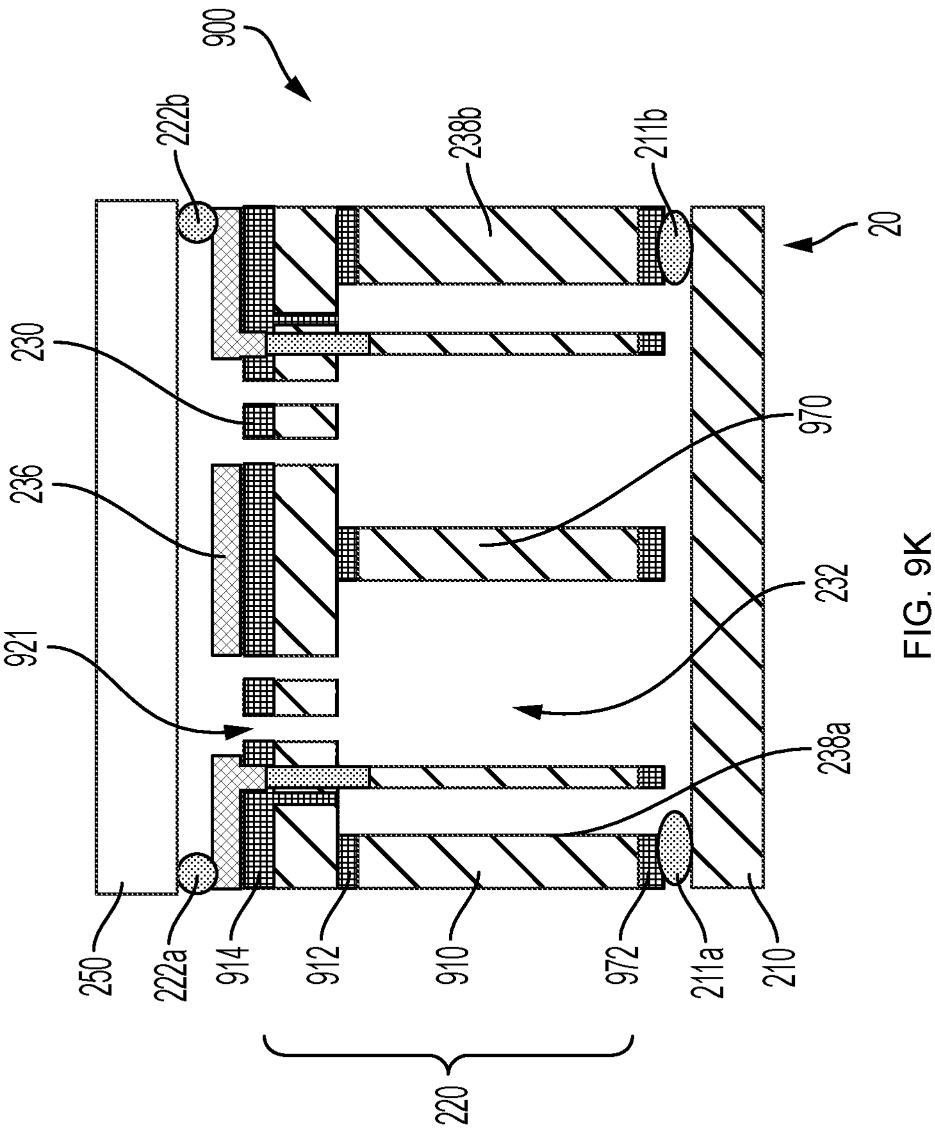

Final structure release is accomplished on the wafer topside in FIG. 9K using a combination of dry etching of silicon dioxide and silicon, which punctures through the trenches 921 to suspend the movable elements of the mirror 236 and the frame 230. In addition, the release etch promotes electrical isolation by separating, for example, the silicon of the frame 230 from the silicon of surrounding members 238*a*, 238*b* and device wafer 220. The vias 952 serve to connect the regions of silicon to the metal interconnects 956 (shown in FIG. 9G). To seal the mirrors from the outside environment, a lid wafer 250 is bonded to the device wafer 220, e.g., through the bonding elements 222*a* and 222*b* (e.g., frit glass seal). The lid wafer 250 is typically glass that allows incoming light to be transmitted with low loss in the mirror cavity 242, reflect off of the upper surface of the mirror 236, and transmit out of the mirror cavity 242.

Figure 10A:
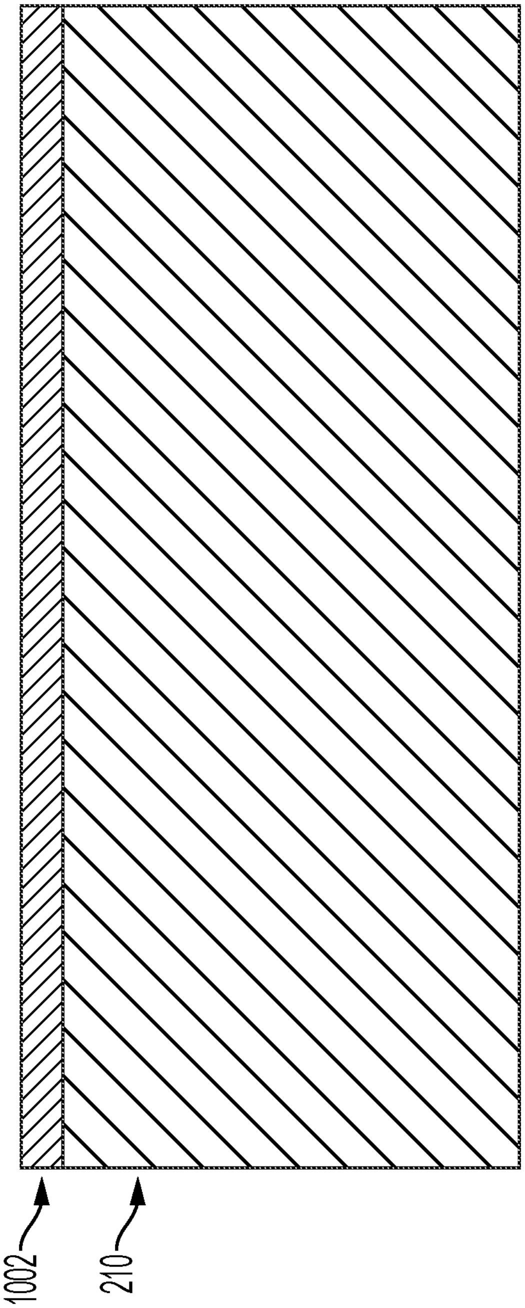
FIGS. 10A-C illustrate another variation prior to bonding.
Figure 10B:
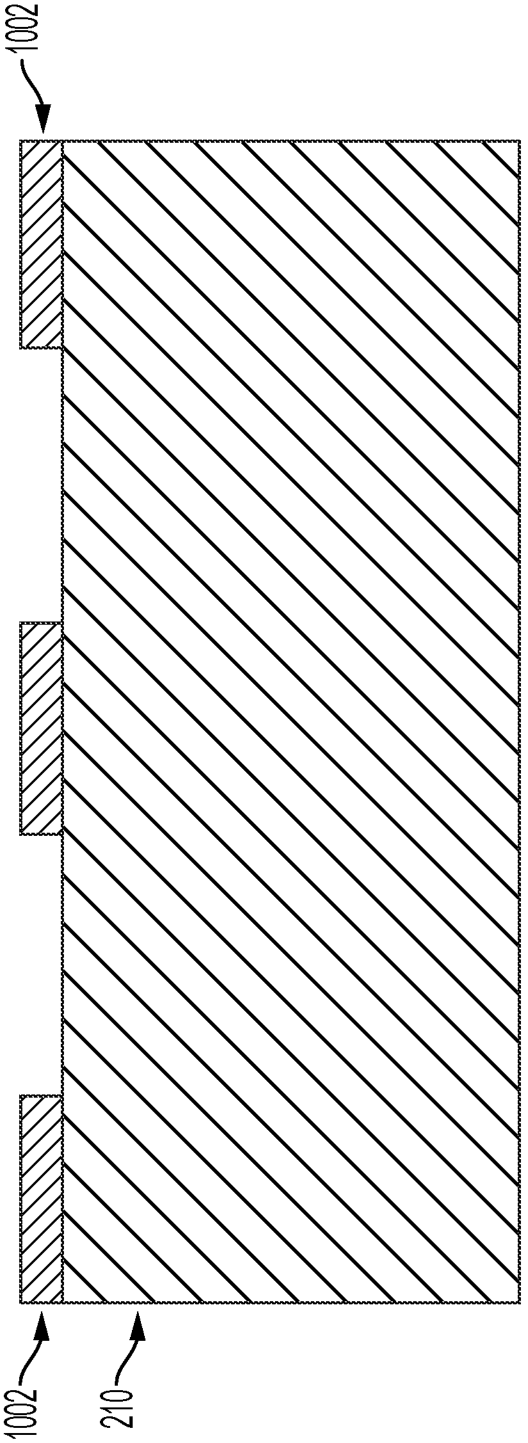
Figure 10C:
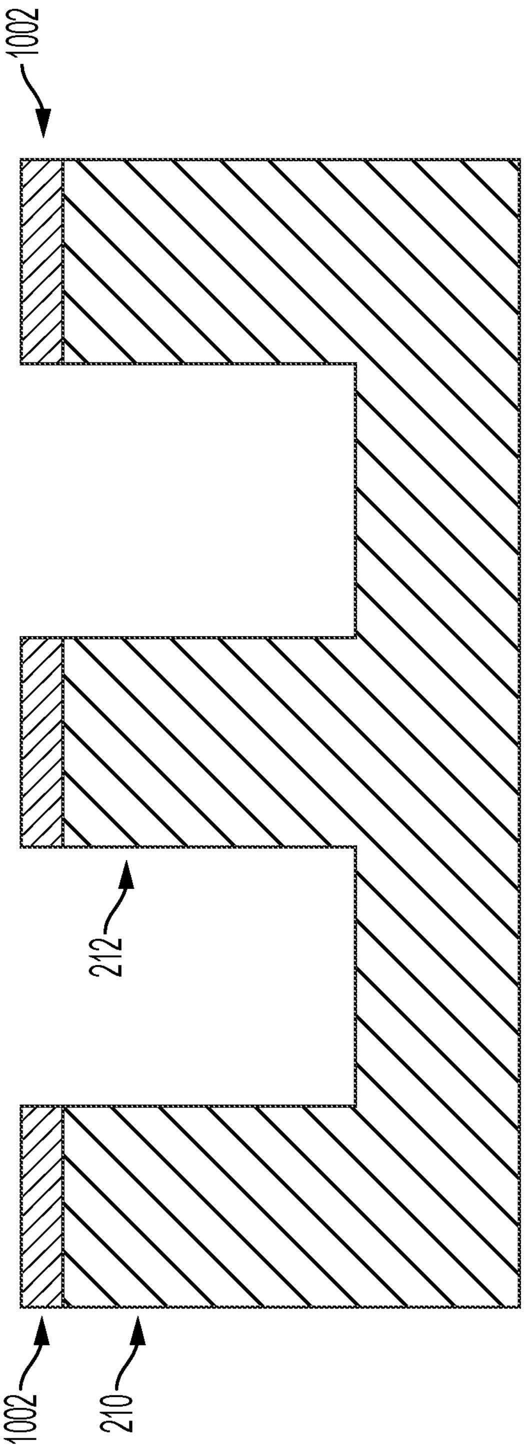

In another variation, prior to bonding with device wafer 220, the silicon wafer 210 is coated with a masking layer 1002 (shown in FIG. 10A). This masking layer may be comprised of a combination of thermally grown silicon oxide and oxide deposited by chemical vapor deposition. It may also be comprised of a metal layer such as aluminum, germanium, or gold such as may be used for a eutectic or thermo-compression bond. The masking layer 1002 is patterned using standard lithography and reactive ion etching (as shown in FIG. 10B). Silicon etching transfers the pattern of the masking layer 1002 into the silicon wafer 210 substrate to obtain the support anchors 212*b* and the bonding surfaces 212*a* and 212*c*. The etching is performed using deep silicon etching at high selectivity to oxide using the techniques disclosed in U.S. Pat. No. 5,501,893. The etch depth allows the blades 970 to swing through high rotation angles without impedance. Typically, the depth used is greater than 25 um. The silicon wafer 210 is bonded to the device wafer 220 using, for example, eutectic bonding, thermo-compression bonding, fusion bonding or anodic bonding at 212*a* and 212*c*. During the bonding process, the support anchors 212*b* may contact the support webbing 234 (as shown in FIG. 2B). In some configurations, the support anchors 212*b* bond to the support webbing 234. In other configurations, the support anchors 212*b* are near but not in contact with the support webbing 234. Bonding or contact between the support anchors 212*b* and the support webbing 234 reduces any coupled mechanical motion from the mirrors 236 through their common anchors.

While preferred embodiments of the present invention have been shown and described herein, it will be obvious to those skilled in the art that such embodiments are provided by way of example only. Numerous variations, changes, and substitutions will now occur to those skilled in the art without departing from the invention. It be understood that various alternatives to the embodiments of the invention described herein may be employed in practicing the invention. It is intended that any claims presented define the scope of the invention and that methods and structures within the scope of these claims and their equivalents be covered thereby.

What is claimed:

1. A microelectromechanical (MEM) array, comprising:
- a first stage comprising a first stage reflective surface;
- a second stage comprising a second stage reflective surface;
- a base wafer positioned below the first stage and the second stage;
- a first frame pivotally coupled to the first stage;
- wherein the first frame is pivotally coupled to a second frame comprising a second frame high aspect ratio (AR) member; and
- wherein the second frame high AR member is positioned to be in contact with a mirror cavity wall of the first stage, and the contact between the second frame high AR member and the mirror cavity wall of the first stage is operable to reduce a mechanical motion of the second stage.

2. The MEM array of claim 1, wherein the second frame comprises an additional second frame high AR member.

3. The MEM array of claim 2, wherein the additional second frame high AR member is positioned to be in contact with a mirror cavity wall of the first stage, and the contact between the additional second frame high AR member and the mirror cavity wall is operable to reduce the mechanical motion of the second stage.

4. The MEM array of claim 2, wherein the additional second frame high AR member is substantially parallel to the second frame high AR member.

5. The MEM array of claim 2, wherein the second frame high AR member and the additional second frame high AR member have overlapping x-axis coordinates.

6. The MEM array of claim 1, wherein the second frame comprises one or more side-flanking members, wherein the one or more side-flanking members are substantially perpendicular to the second frame high AR member.

7. The MEM array of claim 1, wherein the mechanical motion comprises harmonic resonance.

8. The MEM array of claim 1, wherein the first frame is pivotally coupled to a third frame comprising a third frame high AR member positioned to be in contact with the mirror cavity wall, a fourth frame comprising a fourth frame high AR member positioned to be in contact with the mirror cavity wall, and a fifth frame comprising a fifth frame high AR member positioned to be in contact with the mirror cavity wall.

9. The MEM array of claim 1, wherein the second frame is substantially free of apertures.

10. The MEM array of claim 1, wherein the base wafer comprises a support anchor operable to reduce mechanical motion of the second stage.

11. The MEM array of claim 1, wherein one or more of:
- the second frame is a stationary frame,
- the base wafer comprises a silicon wafer,
- the first stage reflective surface has a first resonant frequency, and
- the second stage reflective surface has a second resonant frequency.

12. A microelectromechanical (MEM) actuator array, comprising:
- a first stage comprising a first stage reflective surface;
- a second stage comprising a second stage reflective surface;
- a base wafer positioned below the first stage and the second stage;
- a first frame pivotally coupled to the first stage, wherein the first frame is pivotally coupled to a first stationary frame, wherein the first stationary frame is coupled to a first stationary frame support anchor that is operable to reduce a mechanical motion of the second stage; and
- a first stationary frame high aspect ratio (AR) member that is positioned to be in contact with a mirror cavity wall of the first stage.

13. The MEM of claim 12, further comprising an additional first stationary frame high AR member that is positioned to be in contact with the mirror cavity wall of the first stage.

14. The MEM of claim 12, further comprising an additional first stationary frame high AR member that is substantially parallel to the first stationary frame high AR member.

15. The MEM of claim 12, further comprising an additional first stationary frame high AR member, wherein the first stationary frame high AR member and the additional first stationary frame high AR member have overlapping x-axis coordinates.

16. The MEM of claim 12, wherein the first stationary frame comprises one or more side-flanking members, wherein the one or more side-flanking members are substantially perpendicular to the first stationary frame high AR member.

17. The MEM of claim 12, wherein the first stationary frame is substantially free of apertures.

18. The MEM of claim 12, wherein the base wafer comprises a support anchor positioned between the first stage and the second stage to reduce mechanical motion of the second stage.

19. The MEM of claim 12, further comprising:
- a second stationary frame coupled to a second stationary frame support anchor that is operable to reduce mechanical motion of a third stage,
- a third stationary frame coupled to a third stationary frame support anchor that is operable to reduce mechanical motion of a fourth stage, and
- a fourth stationary frame coupled to a fourth stationary frame support anchor that is operable to reduce mechanical motion of a fifth stage.

20. A method for reducing coupling between adjacent stages in a microelectromechanical (MEM) array, comprising:
- coupling a moveable frame to a stage with a reflective surface, and a stationary frame; and reducing a transfer of mechanical motion from the stage to an adjacent stage by one or more of:

coupling one or more stationary frame high aspect ratio (AR) members to the stationary frame, or coupling one or more stationary frame support anchors to the stationary frame, wherein the one or more stationary frame high aspect ratio (AR) members are positioned to contact a mirror cavity wall.

21. The method of claim 20, wherein the one or more stationary frame support anchors have a selected surface area that is oriented towards a surface area of one or more side flanking members of the stationary frame.

22. The method of claim 20, wherein the stationary frame comprises one or more side-flanking members that are substantially perpendicular to the one or more stationary frame high AR members.

23. The method of claim 20, wherein the stationary frame is substantially free of apertures.

24. The MEM array of claim 1, further comprising a lid wafer positioned above the first stage and the second stage to seal the first stage and the second stage from an outside environment, wherein the lid wafer comprises glass.

25. The MEM array of claim 1, wherein the first stage is coupled to the first frame by a pair of central stage flexures, and wherein each of the pair of central stage flexures comprises a plurality of torsion beams.

26. The MEM array of claim 1, wherein the first frame comprises a support beam between the first frame and an end bar.

27. The MEM array of claim 1, wherein the first frame comprises a support beam configured to apply tension to a central stage flexure coupling the first frame to the first stage.

28. The MEM array of claim 1, wherein a longitudinal length of the second frame high AR member is at least five times greater than a transverse length of the second frame high AR member.

29. The MEM array of claim 12, wherein a longitudinal length of the first stationary frame high AR member is at least five times greater than a transverse length of the first stationary frame high AR member.

30. The method of claim 20, wherein a longitudinal length of the one or more stationary frame high AR members is at least five times larger than a transverse length of the one or more stationary frame high AR members.

* * * * *